(12) United States Patent
Moeckly et al.

(10) Patent No.: US 7,867,950 B2
(45) Date of Patent: Jan. 11, 2011

(54) RF-PROPERTIES-OPTIMIZED COMPOSITIONS OF (RE)BA$_2$CU$_3$O$_{7-\delta}$ THIN FILM SUPERCONDUCTORS

(75) Inventors: Brian Moeckly, Santa Barbara, CA (US); Viktor Gliantsev, San Jose, CA (US); Shing-jen (Luke) Peng, Mountain View, CA (US); Balam Willemsen, Newbury Park, CA (US)

(73) Assignee: Superconductor Technologies, Inc., Santa Barbara, CA (US)

( * ) Notice: Subject to any disclaimer, the term of this patent is extended or adjusted under 35 U.S.C. 154(b) by 1232 days.

(21) Appl. No.: 11/317,889

(22) Filed: Dec. 22, 2005

(65) Prior Publication Data

US 2006/0229211 A1 Oct. 12, 2006

Related U.S. Application Data

(60) Provisional application No. 60/639,043, filed on Dec. 23, 2004.

(51) Int. Cl.
*H01L 39/00* (2006.01)

(52) U.S. Cl. .............. 505/779; 505/776; 505/777; 505/778; 505/780

(58) Field of Classification Search .......... 505/776–780
See application file for complete search history.

(56) References Cited

U.S. PATENT DOCUMENTS

| | | | |
|---|---|---|---|
| 5,071,830 A | | 12/1991 | Olson et al. |
| 5,358,926 A | | 10/1994 | Olson et al. |
| 5,508,255 A | | 4/1996 | Eddy |
| 5,650,376 A | * | 7/1997 | Badaye et al. .............. 505/238 |
| 5,863,869 A | | 1/1999 | Chaudhari et al. |
| 6,022,832 A | * | 2/2000 | Fritzemeier et al. ......... 505/461 |
| 6,063,736 A | * | 5/2000 | Miryara et al. ............. 505/126 |

(Continued)

FOREIGN PATENT DOCUMENTS

EP 0280812 B1 9/1988

(Continued)

OTHER PUBLICATIONS

Achutharaman, et al., "Origin of RHEED Intensity Oscillations During The Growth of (Y,Dy)Ba$_2$,Cu$_3$O$_{7-x}$ Thin Films", Physical Review B, vol. 50, No. 11, Sep. 15, 1994, pp. 8122-8125.

Bednorz, et al., "Possible High T$_c$ Superconductivity in the Ba-La-Cu-O System", Z.Phys. B—Condensed Matter, vol. 64, 1986, pp. 189-193.

(Continued)

*Primary Examiner*—Stanley Silverman
*Assistant Examiner*—Paul A Wartalowicz
(74) *Attorney, Agent, or Firm*—David B. Murphy; O'Melveny & Myers

(57) ABSTRACT

The films of this invention are high temperature superconducting (HTS) thin films specifically optimized for microwave and RF applications. In particular, this invention focuses on compositions with a significant deviation from the 1:2:3 stoichiometry in order to create the films optimized for microwave/RF applications. The RF/microwave HTS applications require the HTS thin films to have superior microwave properties, specifically low surface resistance, $R_s$, and highly linear surface reactance, $X_s$, i.e. high $J_{IMD}$. As such, the invention is characterized in terms of its physical composition, surface morphology, superconducting properties, and performance characteristics of microwave circuits made from these films.

32 Claims, 33 Drawing Sheets

U.S. PATENT DOCUMENTS

| | | | |
|---|---|---|---|
| 6,110,278 A * | 8/2000 | Saxena | 117/95 |
| 6,172,007 B1 * | 1/2001 | Yamaguchi et al. | 505/124 |
| 6,216,941 B1 * | 4/2001 | Yokoyama et al. | 228/180.22 |
| 6,506,709 B1 * | 1/2003 | Yamazaki | 505/125 |
| 6,630,425 B1 | 10/2003 | Batlogg et al. | |
| 6,635,603 B1 | 10/2003 | Batlogg et al. | |
| 6,638,894 B1 | 10/2003 | Batlogg et al. | |
| 6,669,774 B1 * | 12/2003 | Zhang et al. | 117/4 |
| 7,056,866 B1 | 6/2006 | Chu | |
| 7,112,556 B1 * | 9/2006 | Yamazaki | 505/126 |

FOREIGN PATENT DOCUMENTS

| | | |
|---|---|---|
| EP | 0287749 A1 | 10/1988 |
| EP | 0341266 B1 | 11/1989 |
| EP | 0275343 A1 | 7/1998 |
| WO | WO 88/05029 A1 | 7/1988 |

OTHER PUBLICATIONS

Cantoni, et al., "Phase Stability For the in situ Growth of $Nd_{1+x}Ba_{2-x}Cu_3O_y$ Films Using Pulsed-Laser Deposition", Applied Physics Letters, vol. 74, No. 1, Jan. 4, 1999, pp. 96-98.

Cava, et al., "Bulk Superconductivity at 91 K in Single-Phase Oxygen-Deficient Perovskite $Ba_2YCu_3O_{9-\delta}$", Physical Review Letters, vol. 58, No. 16, Apr. 20, 1987, pp. 1676-1679.

Chandrasekhar, et al., "The Growth of $DyBa_2Cu_3O_{7-x}$ On Stepped Surfaces", Physica C 205, 1993, pp. 161-169.

Chen, et al., "Ion Size Effect On Normal State Resistivity In $(R_{0.8}Pr_{0.2})Ba_2Cu_3O_{7-\delta}$(R=Sm, Eu, Gd, Dy, Ho, Er, Tm, and Yb) Systems", J.App. Phys., vol. 78, No. 8, Oct. 15, 1995, pp. 5212-5214.

Chen, et al., Ion-Size Effect on Normal State Transport Properties in $R_{0.8}Pr_{0.2}Ba_2Cu_3O_{7-y}$ Systems (R=Yb, Er, Dy, Gd, Eu, and Nd), Physical Review B, vol. 53, No. 9, Mar. 1, 1996, pp. 5839-5847.

Cochrane, et al., "Electron Microprobe Analysis and Synchrotron Diffraction Study of Crystalline $(Nd_{0.5}Y_{0.5})Ba_2Cu_3O_{7-\delta}$", Physica C 277, 1997, pp. 213-218.

Chu, et al., "Superconductivity At 52.5 K in the Lanthanum-Barium-Copper-Oxide", Science, vol. 235, No. 4788, Jan. 30, 1987, pp. 567-569.

Chu, et al., "Evidence for Superconductivity Above 40 K in the La-Ba-Cu-O Compound System", Physical Review Letters, vol. 58, No. 4, Jan. 26, 1987, pp. 405-407.

Dahm, et al., "Theory of Intermodulation in a Superconducting Microstrip Resonator", J.Appl. Phys., vol. 81, No. 4, Feb. 15, 1997, pp. 2002-2009.

Feng, et al., "Influence of Ho Substitution for Y on Flux Pinning in Melt-Processed YBCO Superconductors", Physica C 357-360, 2001, pp. 799-802.

Fincher, Jr., et al., "Ce and Tb Substitution for Y in $YBa_2Cu_3O_7$ Thin Films", Physical Review Letters, vol. 67, No. 20, Nov. 11, 1991, pp. 2902-2905.

Grant, et al., "Superconductivity Above 90 K in the Compound $YBa_2Cu_3O_x$: Structural, Transport, and Magnetic Properties", Physical Review B, vol. 35, No. 13, May 1, 1987, pp. 7242-7244.

Guan, et al., Ion Size Effect of Rare Earth on Tc, Tn and $\rho n$ in $(R_{1-x}Pr_x)Ba_2Cu_3O_{7-y}$ Systems (R=Lu, Yb, Tm Er, Y, Ho, Dy, Gd, Eu, Sm and Nd), Physica C 235-240, 1994, pp. 781-782.

Hammond, et al., "Intrinsic Limits on the Q and Intermodulation of Low Power High Temperature Superconducting Microstrip Resonators", Journal of Applied Physics, vol. 84, No. 10, Nov. 15, 1998, pp. 5662-5667.

Hazen, et al., "Crystallographic Description of Phases in the Y-Ba-Cu-O Superconductor", Physical Review B, vol. 35, No. 13, May 1, 1987, pp. 7238-7241.

Higashi, et al., "Ex Situ Growth of $NdBa_2Cu_3O_{6+y}$ Films Using (Nd, BaI2, Cu) Precursors by Electron Beam Co-Evaporation", Physica C 378-381, 2002, pp. 1056-1060.

Hor, et al., "Superconductivity Above 90 K in the Square-Planar Compound System $ABa_2Cu_3O_{6+}$ With A=Y, La, Nd, Sm, Eu, Gd, Ho, Er and Lu", Physical Review Letters, vol. 58, No. 18, May 4, 1987, pp. 1891-1894.

Hudner, et al., "Thin-Film Growth and Compositional Effects in $YBa_2Cu_3O_{7-x}$ Layers Prepared by Metalorganic Chemical Vapor Deposition", J.Appl. Phys., vol. 74, No. 1, Oct. 1, 1993, pp. 4631-4642.

Inagaki, et al., "Internal Friction of $RBa_2Cu_3O_y$(R=Y, Er, Ho, Dy, Sm and Nd) At 200 kHz Near Orthorhombic-to-Tetragonal Phase Transition", Physica C 334, 2000, pp. 295-300.

Jia, et al., "The Role of a Superconducting Seed Layer in the Structural and Transport Properties of $EuBa_2Cu_3O_{7-x}$ Films", Applied Physics Letters, vol. 83, No. 7, Aug. 18, 2003, pp. 1388-1390.

Kwon, et al., "Fabrication and Characterization of (Rare-Earth)-Barium-Copper-Oxide (RE123 with RE=Y, Er, and Sm) Films", IEEE Transactions on Applied Superconductivity, vol. 9, No. 2, Jun. 1999, pp. 1575-1578.

MacManus-Driscoll, et al., "Studies of Structural Disorder in $ReBa_2Cu_3O_{7-x}$ Thin Films (Re=rare earth) As a Function of Rare-Earth Ionic Radius and Film Deposition Conditions", Physica C 232, 1994, pp. 288-308.

Mamutin, et al., "Low Temperature Molecular Beam Epitaxial Growth of DyBaCuO Superconducting Thin Films", Appl. Phys. Lett., vol. 64, No. 15, Apr. 11, 1994, pp. 2031-2033.

Moeckly, et al., "Electromigration Study of Oxygen Disorder and Grain-Boundary Effects in $YBa_2Cu_3O_{7-\delta}$ Thin Films", Physical Review B, vol. 47, No. 1, Jan. 1, 1993, pp. 400-417.

Moeckly, et al., "Growth of $YBa_2Cu_3O_7$ Thin Films on MgO: The Effect of Substrate Preparation", Appl. Phys. Lett., vol. 57, No. 16, Oct. 15, 1990, pp. 1687-1689.

Moodenbaugh, et al., "Superconductivity Near 90 K in the Lu-Ba-O System", Physical Review Letters, vol. 58, No. 18, May 4, 1987, pp. 1885-1887.

Okai, et al, Superconducting Critical Temperature of Overdoped $LnBa_2Cu_3O_{y+\delta y}$ (Ln=La, Nd, Sm, Eu, Gd, Dy, Ho, Er, Tm and Yb), Jpn. J. Appl. Phys., vol. 38, 1999, pp. L1018-L1020.

Prusseit, et al., "Optimized Double Sided $DyBa_2Cu_3O_{7-}$ Thin Films for RF Applications", Physica C 392-296, 2003, pp. 1225-1228.

Qi, et al., "Liquid-phase Epitaxial Growth of $REBa_2Cu_3O_{7-\delta}$(RE=Y, Yb, Er) Thick Films At Reduced Temperatures", Journal of Crystal Growth 213, 2000, pp. 312-318.

Schougaard, et al., "Evidence for High Stability Against Water Corrosion of Relative to $NdBa_2Cu_3O_{7\pm\delta}$Relative to $YBa_2Cu_3O_{7-\delta}$and $EuBa_2Cu_3O_{7-\delta}$", Applied Physics Letters, vol. 84, No. 7, Feb. 16, 2004, pp. 1144-1146.

Tung, et al., Ion-size Effect on Superconducting Transition Temperature $T_c$ in $R_{1-x-y}Pr_xCa_y$ $Ba_2Cu_3O_{7-z}$Systems (R=Er, Dy, Gd, Eu, Sm, Nd), Physical Review B, vol. 59, No. 6, Feb. 1, 1999, pp. 4504-4512.

Waffenschmidt, et al., "Composition of Dependence of Microwave Properties of Y-Ba-Cu-O Thin Films Grown by Metal-Organic Chemical-Vapor Deposition", J.Appl. Phys., vol. 77, No. 1, Jan. 1, 1995, pp. 438-440.

Williams, et al., "Ion Size Effects on $T_c$ and Interplanar Coupling in $RBa_2Cu_3O_{7-z}$", Physica C 258, 1996, pp. 41-46.

Wu, et al., "The Influence of La Substitution for Ba in $YBa_2Cu_3O_7$ Cuprates", Physica C 315, 1999, pp. 215-222.

Xu, et al., "Rare-Earth Ion Size Effect on Resistivity, Susceptibility, and Superconductivity of $RBa_2Cu_{3-x}Zn_xO_{7-y}$(R=Yb, Er, Y, Dy, Gd, Eu, Sm, and Nd)", Physical Review B, vol. 53, No. 22, Jun. 1, 1996, pp. 245-253.

Xu, et al., "Ion-Size Effect on $T_c$ in $(R_{1-X}Pr_x)Ba_2Cu_3O_{7-Y}$ Systems (R=Nd, Eu, Gd, Dy, Y, Er and Yb)", Physical Review B, vol. 45, No. 6, Feb. 1, 1992, pp. 3176-3179.

Xu, et al., "Substitution for Ba by Light Rare-Earth in Eu123 Solid Solutions", Physica C 341-348, 2000 pp. 613-614.

Chew, et al., "Effect of Small Changes in Composition on the Electrical and Structural Properties of $YBa_2Cu_3O_7$ Thin Films", Appl. Phys. Lett., vol. 57, 19, Nov. 5, 1990, pp. 2016-2018.

Hein, *High-Temperature-Superconductor Thin Films at Microwave Frequencies*, Springer Tracts in Modern Physics, 144 (Springer Verlag, Heidelberg, 1990).

* cited by examiner

RF-PROPERTIES-OPTIMIZED COMPOSITIONS OF $(RE)Ba_2Cu_3O_{7-\delta}$ THIN FILM SUPERCONDUCTORS

CROSS-REFERENCE TO RELATED APPLICATIONS

This application claims priority pursuant to 35 U.S.C. §119(e) to U.S. Provisional Application No. 60/639,043, filed Dec. 23, 2004.

FIELD OF THE INVENTION

This invention relates to thin films of high temperature superconducting compositions optimized for RF applications and a method for manufacturing them, more specifically rare earth compositions of $(RE)Ba_2Cu_3O_{7-\delta}$ deviating significantly from the 1:2:3 stoichiometry.

BACKGROUND OF THE INVENTION

Rare earth oxide superconductors and their ability to superconduct at significantly higher temperatures than previously recorded was first reported by J. G. Bednorz and R. A. Muller in 1986 in regard to mixtures of lanthanum, barium, copper and oxygen in an article entitled "Possible High $T_c$ Superconductivity in the Ba—La—Cu—O system." (64 Z. Phys. B.—Condensed Matter, pp 189-193 (1986)). Bednorz and Muller described Ba—La—Cu—O compositions that offered a substantial increase in the critical temperature at which the material becomes superconducting over what had been previously known for other classes of materials. Here, the composition was $La_{5-x}Ba_xCu_5O_{5(3-y)}$ where x=0.75-1, y>0, and the abrupt change in resistivity occurred in the 30 Kelvin range.

This contribution led to intensive investigation in order to develop materials having even higher transition temperatures, preferably above 77 Kelvin as this enabled the use of liquid nitrogen to cool the superconducting equipment. In 1987, C. W. Chu and co-workers at the University of Houston found that the onset $T_c$ of the La—Ba—Cu—O compound could by increased to over 50 K by the application of pressure. (Phys. Rev. Lett. 58, 405 (1987); Science 235, 567 (1987)).

Chu and coworkers at Houston and at the University of Alabama subsequently discovered a mixed-phase Y—Ba—Cu—O system onset having $T_c$ values near 90 K and a zero-resistance state at ~70 K. This compound had the nominal composition $Y_{1.2}Ba_{0.8}CuO_{4-\delta}$. (Phys. Rev. Lett. 58, 908 (1987). Chu and coworkers as well as scientists at AT&T and IBM later showed this compound to consist of two phases of nominal composition $Y_2BaCuO_5$ (the "green" phase) and $YBa_2Cu_3O_{6+x}$ (the "black" phase). The latter phase was determined to be the superconducting phase, whereas the former was semiconducting (Cava et al., Phys. Rev. Lett. 58, 1676 (1987); Hazen et al., Phys. Rev. B 35, 7238 (1987); Grant et al., Phys. Rev. Lett. 35, 7242 (1987).

Superconductivity near 90 K was also reported in a mixed-phase Lu—Ba—Cu—O compound by Moodenbaugh and coworkers (Phys. Rev. Lett. 58, 1885 (1987). Chu et al. also identified superconductivity above 90 K for compounds of the formula $ABa_2Cu_3O_{6+x}$, where A=Y, La, Nd, Sm, Eu, Gd, Ho, Er, or Lu (Phys. Rev. Lett. 58, 1891 (1987).

The data from these differing Rare Earth (RE)BCO (RE=rare earth, B=Ba, C=Cu) compounds demonstrated that for this class of compounds, the superconductivity is associated with the $CuO_2$—Ba—$CuO_2$—Ba—$CuO_2$ plane assembly which can be disrupted by the A cations only along the c-axis.

Following this discovery, research was focused on the YBCO class of compounds with high temperature superconducting (HTS) properties. B. Batlogg first discovered and isolated the single crystallographic phase responsible for the superconducting properties of the YBCO compound. (B. Batlogg, U.S. Pat. No. 6,635,603). In isolating this single perovskite phase of a composition, Batlogg admonished that the composition was essential to isolation of the phase and that it must be within 10% of the $M_2M'Cu_3O_{7-\delta}$ composition where M is a divalent cation preferably barium and M' is a trivalent cation preferably yttrium.

Other studies have investigated both the effects of substitution of various rare earth elements for yttrium and of varying the 1:2:3 ratio of Y:Ba:Cu on the superconducting properties of HTS compositions. Multiple studies have shown the ability to partially or completely substitute rare earth elements except Pr, Ce and Tb and maintain a $T_c$ of approximately 90 K for the resulting (RE)BCO composition. (S. Jin, Physica C 173, pp 75-79 (1991)). Additionally, further studies show that the c-axis coherence length and the $T_c$ value increase with increasing ionic radius of the rare earth element substituted for yttrium (G. V. M. Williams, Physica C 258, pp 41-46 (1996)).

Building on these discoveries, P. Chaudhari and his co-workers at IBM developed a method for making thin films of high temperature superconducting oxides with a nominal composition of $(RE)(AE)_2Cu_3O_{9-y}$ where RE is a rare earth element, AE is an alkaline earth element and y is sufficient to satisfy valence demands. (Chaudhari, U.S. Pat. No. 5,863,869 (1999)). The rare earth elements used included Y, Sc and La, and AE could also be substituted for by Ba, Ca or Sr. Copper was the preferred transition metal for the oxide due to its high superconducting onset temperature and the smooth, uniform properties of the copper oxide films. Using this growth process, Chaudhari was able to obtain YBCO films with superconducting onset temperatures of about 97 Kelvin that exhibited superconducting behavior from 50 Kelvin to in excess of 77 Kelvin. These films were within 15% of the targeted $(RE)(AE)_2Cu_3O_{9-y}$ composition, and Chaudhari noted that the exact composition was not necessary in order to observe high temperature superconductivity.

However, in another study of (RE)BCO cation exchange in thin films, J MacManus-Driscoll et al. noted that $T_c$ decreased dramatically for off-composition films with substitutions of rare earth (RE) elements on the Ba site such as $RE(Ba_{2-x}RE_x)Cu_3O_y$, where RE=Er or Dy and x>0.1 (14% deviation) and where RE=Ho and x>0 (any deviation). (J. L MacManus-Driscoll, Physica C 232, pp 288-308 (1994). J. MacManus-Driscoll further reported that the oxygen pressure at which the thin films were grown seemed to have an effect on the structural disordering of the RE and Ba cations as did the rare earth ion size. Small rare earth cations substituting for the larger Ba cations would produce large strains on the lattice and therefore an unstable phase which would not likely occur.

Another study of varying the 1:2:3 stoichiometry of YBCO thin films noted that large excesses of yttrium formed ultra small yttrium precipitates leading to increased surface resistance ($R_s$) and poor microwave quality but that a slightly enhanced copper and yttrium content lead to minimum surface resistance (E. Waffenschmidt, J. Appl. Phys. 77 (1) pg 438-440). Furthermore, N. G. Chew et al. analyzed the effect of slight changes in composition on YBCO thin film structural and electrical properties and discovered that films grown with a stoichiometry close to 1:2:3 or with excess yttrium are smooth while films with excess barium exhibited surface roughness and growth of a-axis-oriented grains. (N. Chew, Appl. Phys. Lett. 57 (19) pp 2016-2018 (1990). These authors further found that there is a well defined YBCO composition where $T_c$ and $J_c$ are maximized and the c-axis lattice constant, (007) x-ray peak width, and surface roughness are minimized. These quantities were optimized for a Ba/Y ratio of 2.22±0.05 (subsequently suggested to instead be equal to 2) and a Cu/(Y+Ba+Cu) ratio of 0.5. Slight changes in cation ratios away from this optimized composition caused significant degradation in the parameters listed above.

W. Prusseit et al. have created an iso-structural Dy-BCO thin film material with improved properties compared to their YBCO films. By substituting dysprosium for yttrium and growing under identical conditions as YBCO, Prusseit created films that deviated only slightly from the 1:2:3 stoichiometry. Compared to their YBCO films, these materials exhibited better chemical stability and enhanced transition temperatures (by 2-3 K), and they also had a 20% reduction in surface resistance ($R_s$) at 77 K: ~250 µΩ vs. ~300 µΩ at 10 GHz, measured in a microwave cavity (W. Prusseit, Physica C 392-396, pp 1225-1228 (2003)). Hein (*High-Temperature Superconductor Thin Films at Microwave Frequencies* (Springer Tracts in Modern Physics, 155), Berlin, 1999) and others have measured somewhat lower surface resistance, ~200 µΩ at 10 GHz and 77 K, in cavity measurements of YBCO thin films.

The compositions of these (RE)BCO compounds may be altered substantially from the nominal 1:2:3 stoichiometry in order to optimize their properties for specific applications. It is the primary object of this invention to provide high temperature superconducting thin films that have the lowest possible RF surface resistance ($R_s$) values as well as the lowest achievable RF nonlinearities. This often requires fabrication of (RE)BCO films that deviate significantly from the 1:2:3 composition. It is another object of this invention to provide a thin film superconductor that is optimized for RF/microwave applications. It is another object of this invention that the film has a low surface resistance. It is another object of this invention that the film has a highly linear RF/microwave surface reactance. It is another object of this invention that the stoichiometry of the film deviates by at least 10% from the standard 1:2:3 stoichiometry and with full substitution for yttrium by a rare earth element.

SUMMARY OF THE INVENTION

The films of this invention are high temperature superconducting (HTS) thin films specifically optimized for microwave and RF applications. The prior art (RE)BCO films exhibiting high temperature superconducting properties were nominally of the composition $(RE)_xBa_yCu_3O_{7-\delta}$ where RE=a rare earth element, preferably yttrium, x=1, y=2 and $0 \leq \delta \leq 1$. This 1:2:3 stoichiometry has since been the focus of much study including varying the rare earth element, full and partial substitutions for RE, for Ba, and for Cu, oxygen doping, and deviations from the 1:2:3 stoichiometry.

The present invention focuses on RE HTS films specifically optimized for microwave and RF applications. The RF/microwave HTS applications require the HTS thin films to have superior microwave properties, specifically low surface resistance, $R_s$, and highly linear surface reactance, $X_s$, i.e. high $J_{IMD}$. As such, the invention is characterized in terms of its physical composition, surface morphology, superconducting properties, and performance characteristics of microwave circuits made from these films In particular, this invention focuses on compositions having a significant deviation from the 1:2:3 stoichiometry in order to create the films optimized for microwave/RF applications. These films have a RE:Ba ratio of less than 1.8, which deviates more than 10% from the typical ratio of 2, and preferably less than 1.7. The research has shown that the highest quality factor values, Q, representing the surface resistance of patterned films, peak at a particular Ba:RE ratio for each RE and that these ratios deviate significantly from the 1:2:3 stoichiometry.

Additionally, the performance characteristics of the HTS films naturally affect their efficacy in RF/microwave HTS applications. Specifically desirable are low surface resistance, $R_s$, (<15 micro-ohms at 1.85 GHz and 77 K) and highly linear surface reactance, $X_s$, i.e., high $J_{IMD}$ values (>$10^7$ A/cm$^2$, preferably >$5 \times 10^7$ A/cm$^2$ at 77 K). HTS thin films with such properties permit the fabrication of extremely selective filters (60-dB rejection within 0.2% relative frequency, to 100-dB rejection within 0.02% relative frequency, with extremely low in-band insertion loss (<1-dB, preferably <0.2-dB) in an extremely small size (<10-cm$^2$ filter chips), which can handle the interference power levels experienced at the front end of a cellular telephone base station receiver (−50 dBm to −28 dBm, to as high as −12 dBm to 0 dBm or possibly even higher) without producing undesirable distortion in the passband, particularly intermodulation distortion, and more particularly intermodulation distortion products comparable to background noise levels (−173.8 dBm/Hz). Thus, the films of this invention are also characterized by their optimized microwave and RF properties. These and other objects, features and advantages will be apparent from the following more particular description of the preferred embodiments.

Figure 1:
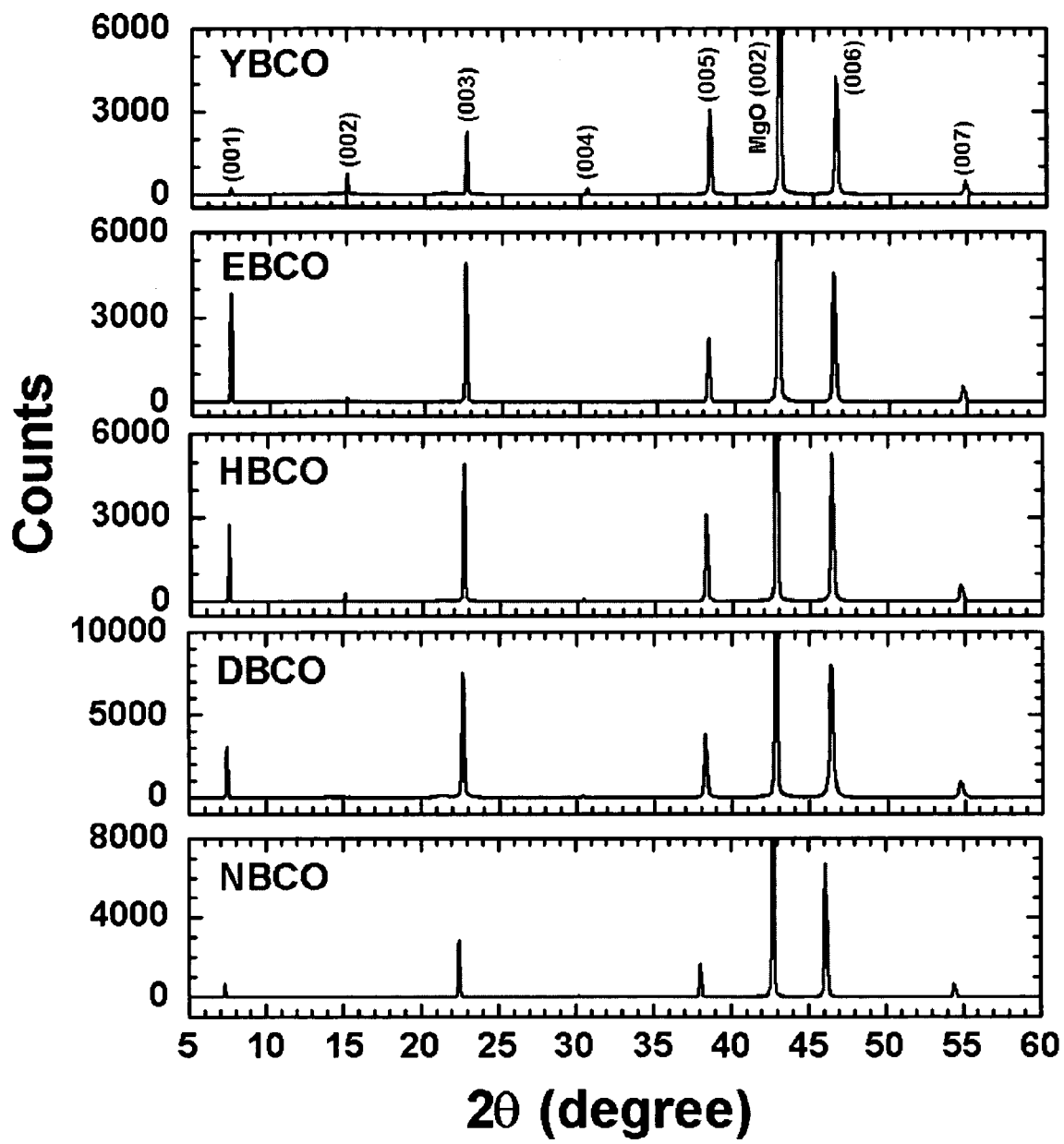
FIG. 1 shows θ-2θ x-ray diffraction scans for several (RE)BCO thin films grown on MgO substrates.

Table I displays the maximum $Q_u$ values at ∼1.85 GHz obtained for several of our (RE)BCO thin films measured using a patterned test resonator. The measurements were made at 67 K and 77 K for an input power of −10 dBm. This table also shows the $R_s$ values that we have calculated from these $Q_u$ values.

TABLE I

Unloaded Q values of our highest-Q films measured with our standard test resonator at −10 dBm input power. The $R_s$ values are calculated from these measured Q values. These calculated $R_s$ values of the patterned structures are less than the actual measured $R_s$ values of the bulk films.

| | T = 67 K | | | T = 77 K | | |
|---|---|---|---|---|---|---|
| Material | Unloaded Q | $R_s$ (μΩ) | $f_0$ (MHz) | Unloaded Q | $R_s$ (μΩ) | $f_0$ (MHz) |
| YBCO | 83599 | 4.9 | 1847.94 | 50470 | 8.1 | 1848.23 |
| Dy—BCO | 52200 | 7.8 | 1851.13 | 37000 | 11.1 | 1850.29 |
| Ho—BCO | 70500 | 5.8 | 1850.07 | 39000 | 10.5 | 1849.95 |
| Er—BCO | 45300 | 9.0 | 1840.60 | 18800 | 21.8 | 1838.60 |
| Nd—BCO | 80866 | 5.1 | 1847.09 | 59341 | 6.9 | 1848.14 |

DETAILED DESCRIPTION OF THE INVENTION

As previously mentioned, this invention relates to high temperature superconducting (HTS) thin films with compositions that are optimized for RF/microwave applications and methods for reliably producing such films. As such, the invention is characterized in terms of its physical composition, surface morphology, superconducting properties, and performance characteristics of microwave circuits made from these films (filters, delay lines, couplers, etc.; particularly bandpass and bandreject filters, more particularly bandpass and bandreject preselector filters for cellular telephone base station receivers). The distinction between HTS (RE)BCO films of the prior art and the (RE)BCO films of this invention is found both in the composition that deviates significantly from the 1:2:3 stoichiometry and the highly optimized RF properties of the new composition.

Definitions

For our purposes, a thin film may be defined as a layer (generally, very thin) of a material that is grown, deposited, or otherwise applied to a suitable supporting substrate. The thickness of this film may range from about one nm ($10^{-9}$ m) to several microns (>$10^{-6}$ m) thick. The typical range of thin film thickness for many applications is from 100 nm to 1000 nm.

High temperature superconductors (HTS) encompass a broad class of ceramic materials, typically oxides, more typically copper oxides or cuprates, that have a transition temperature or critical temperature, $T_c$, below which these materials are superconducting. Above this critical temperature, they generally behave as metallic, or "normal," conducting materials. HTS materials are further generally characterized as having $T_c$ values above about 30 K. Examples of HTS materials include $La_2CaCu_2O_6$, $Bi_2Sr_2CaCu_2O_8$, $YBa_2Cu_3O_7$, $Tl_2Ba_2CaCu_2O_8$, $HgBa_2CaCu_2O_7$, etc. These materials must have a well-defined crystal structure in order to be superconducting, i.e., they must have a very specific regular and repeated arrangement of their constituent atoms.

The rare earth (RE) elements are the 15 lanthanide elements with atomic numbers 57 through 71 that are in Group IIIA of the Periodic Table: lanthanum, cerium, praseodymium, neodymium, promethium, samarium, europium, gadolinium, terbium, dysprosium, holmium, erbium, thulium, ytterbium, and lutetium. Yttrium (atomic number 39), a Group IIIA transition metal, although not a lanthanide is generally included with the REs as it occurs with them in natural minerals and has similar chemical properties. Commonly included with the REs because of their similar properties are scandium (atomic number 21), also a Group IIIA transition metal, and thorium (atomic number 90), an element in the actinide series of the Periodic Table.

Composition

The most ubiquitous HTS material is YBCO, which consists of an ordered amount and arrangement of Y, Ba, Cu, and O atoms. The fundamental repeated unit of this material's specific atomic arrangement is known as the unit cell, consisting nominally of one Y, two Ba, three Cu, and seven O atoms. The size of this compound's orthorhombic unit cell is about 3.82×3.89×11.68 Angstroms in the a-, b-, and c-axis directions, respectively. The atomic ratios needed to form this compound are described by the chemical formula $YBa_2Cu_3O_{7-\delta}$, where the oxygen content is variable between 6 and 7 atoms per unit cell, or $0 \leq \delta \leq 1$. For single-phase materials with this composition and having high crystalline quality and purity, the $T_c$ value is determined largely by the value of $\delta$. YBCO is a superconductor for $\delta < \sim 0.6$, with values of $\delta$ near 0 being generally preferred in order to provide the highest $T_c$ values.

YBCO is the most widely studied HTS material, and much is known about how to make it in single phase form, i.e., consisting of solely the composition mentioned above and containing no other phases. However, many other similar compounds can also be fabricated that may have similar or superior superconducting properties, depending on the application. These compounds may have Y:Ba:Cu ratios that are different from 1:2:3, and they may also consist of elements other than Y or Ba. A generalized nomenclature for the makeup of this compound may thus be written as $M'_xM_yCu_3O_{7-\delta}$, where M' may in general be any essentially trivalent ion or combination of ions, and M may be any essentially divalent ion or combination of ions. The ratios of M':Cu, M:Cu, and M':M may also vary substantially from the nominal values of 1:3, 2:3, and 1:2, respectively. While the full range of parameter space has not been explored, it is reasonable to believe that compounds with cation ratios deviating from the nominal by as much as 50% may still be superconductors, e.g. 1:6<M':Cu<1:2, 1:3<M:Cu<1:1, and 1:4<M':M<3:4. However, significantly altering the composition from the 1:2:3 stoichiometry does affect the specific properties of the composition including critical current density ($J_c$), normal-state resistivity ($\rho$), critical temperature ($T_c$), and surface resistance ($R_s$).

In order to provide high $T_c$ values, Ba is generally preferred as the divalent element, or M in the above formula. Full or partial substitutions of many elements for Ba tend to decrease $T_c$ or destroy superconductivity altogether. These elements include Sr, La, Pr and Eu. (Y. Xu, Physica C 341-348, pp 613-4 (2000) and X. S. Wu, Physica C 315, pp 215-222 (1999). Similarly, the Cu atoms may be doped with Co, Zn, Ni, etc., the effect of most of which is to decrease $T_c$, though the absolute effect (e.g., charge transfer or disruption of superconductivity on the Cu—O planes) depends on whether the Cu(1) or Cu(2) sites are affected. (Y. Xu, Phys. Rev. B Vol 53, No. 22, pp 15245-15253 (1996). Some partial substitutions on the Y sites may have a similar effect, such as Ca, Ce, and Pr (L. Tung, Phys. Rev. B Vol 59, No. 6, pp 4504-4512 (1999) and C. R. Fincher, Phys. Rev. Lett. 67 (20) pp 2902-2905 (1991)). However, there are many known partial or complete substitutions for Y that lead to similarly high or greater $T_c$ values than YBCO. Many of these known substitutions come from the rare earth family of elements. In general, rare earth elements that have a larger ionic radius produce higher $T_c$ values for these (RE)BCO compounds (G. V. M. Williams, Physica C 258, pp 41-46 (1996)).

While it is key to maintain the defining property of superconductivity across the range of compositions available for these related compounds, our research has shown that the compositions may be altered substantially from the nominal 1:2:3 stoichiometry in order to tailor their properties for specific applications. For example, compositions near 1:2:3 may be preferred for multilayer or active device applications for which smooth thin film surfaces are of paramount importance. Conversely, optimization of HTS films for RF applications requires the production of thin films that strike a balance between having the lowest possible RF surface resistance ($R_s$) values and the lowest RF nonlinearities that are achievable. This in turn often requires the fabrication of (RE)BCO films that deviate significantly from the 1:2:3 composition.

The HTS thin films of this invention are optimized for RF applications, and as such they have the lowest possible RF surface resistance ($R_s$) values and the lowest possible RF nonlinearities. In order to achieve this optimization, the film compositions have the nominal formula $(RE)_xBa_yCu_3O_{7-\delta}$ where RE is one of the previously defined rare earth elements, preferably Dy, and where the ratio y:x is preferably between about 1.5-1.8, more preferably between about 1.55-1.75, and most preferably between about 1.6-1.7.

Substrates

The superconducting properties of HTS materials are extremely sensitive to their degree of crystalline perfection. This places severe constraints on the choice of a suitable substrate material on which high-quality HTS films may be grown. Some of these constraints include crystal structure, compatibility with the growth process, chemical compatibility, compatibility with the application, as well as other requirements imposed by nature.

Perhaps the most important requirement is the crystal structure. The substrate must have an appropriate lattice match with the HTS film such that epitaxial growth of the film can occur and a well-oriented film will form. A poor lattice match can lead to dislocations, defects, and misoriented grains in the film. In general, the substrate should be available in single-crystal form in order to meet these requirements.

The substrate must be able to withstand the high processing temperatures during the growth process that are required for the crystallization of the HTS compound. In addition, structural integrity and a reasonable thermal expansion match with the HTS film is required in order to prevent strain and cracking of the film during the cool down cycle from the growth temperature or from any other subsequent thermal cyclings.

The substrate must be chemically compatible with (RE)BCO, non-reactive, and with minimal diffusion into the film at high temperature.

The substrate must be available in a size large enough for the intended use of the HTS thin film. For example, certain passive microwave circuits or high-volume electronics applications require a large substrate size. A minimum substrate of 2" in diameter is typical for these applications, though larger sizes are often desirable if available. The substrate may also be required to have physical properties that are compatible with experimental measurement techniques or applications. For most applications the substrates should be stable, mechanically robust insulators. Other requirements may include transparency in the infrared for optical transmission measurements, constituent elements or structure that do not interfere with spectroscopic measurements such as Rutherford backscattering (RBS) or energy-dispersive x-ray analysis (EDX), and a low dielectric constant and loss tangent for microwave measurements and applications at the intended temperature of operation.

A handful of single-crystal substrates meet some or all of these requirements. Examples include MgO, $Al_2O_3$, $LaAlO_3$, $NdGaO_3$, $(La_{0.18}Sr_{0.82})(Al_{0.59}Ta_{0.41})O_3$, and $SrTiO_3$. The last four have an excellent lattice match to (RE)BCO. The high dielectric constant and loss tangent of $SrTiO_3$ make it useless for microwave applications, however. $LaAlO_3$ and $NdGaO_3$ are better in this regard, though $LaAlO_3$ suffers from the fact that it tends to twin, and these twin boundaries can be formed and become mobile at typical processing temperatures. $Al_2O_3$ is a low-loss substrate and is widely available in several different orientations and sizes. However, it reacts strongly with (RE)BCO at high temperatures, requiring the use of an appropriate buffer layer. In addition, $Al_2O_3$ has a poor thermal expansion match to (RE)BCO, causing a tendency for the films to crack upon cooldown. MgO has relatively low loss and a good thermal expansion match to (RE)BCO, making it a good choice for RF applications. However, MgO has a much larger lattice mismatch than the other examples listed above, so that great care must be taken to insure that the (RE)BCO films grown on MgO are well oriented. In particular, it is relatively common for (RE)BCO films grown on MgO to contain in-plane-rotated grains and 45° grain boundaries. (B. H. Moeckly, Appl. Phys. Lett. 57, 1687-89 (1990). The minimization of the amount of these high-angle grain boundaries is mandatory for good microwave performance, particularly for high RF linearity. Certain MgO substrate surface treatments may be instituted to help control the number of high-angle grain boundaries, but greater effort is required to further suppress formation of these grain boundaries, particularly for demanding RF applications. The growth method, growth conditions, and particularly the composition of the (RE)BCO films must all be chosen and adjusted to minimize the amount of 45° grains in films grown on MgO.

Film Morphology and Microstructure

The anisotropic transport properties of (RE)BCO, its orthorhombic crystal structure, and its small superconductive coherence length mean that the (RE)BCO films must have excellent crystalline structure and orientation. This is particularly true in order to obtain good microwave properties. Hence, the films must be substantially free of secondary phases, they must possess good epitaxy both in-plane (parallel to the substrate surface) and out-of-plane (perpendicular to the substrate surface). Typically, the c-axis of (RE)BCO is aligned perpendicular to the substrate surface. All the grains in the film must be so aligned, and they must be highly aligned with respect to one another. The degree of this crystalline order is typically characterized by θ-2θ x-ray diffraction scans, where the requirements are the existence of only c-axis-oriented (001) spectral lines having narrow peak widths, and also narrow peak widths of the so-called ω-scan, or rocking curve scan about a given Bragg angle. The θ-2θ measurement can also detect the presence of spectral lines due to a-axis-oriented grains within the film. These grains may also be detected by a χ-scan about an appropriate Bragg angle.

For a thin film with good microwave properties, the amount of a-axis grains in the film is ideally zero, so that the intensity of a-axis x-ray peaks relative to c-axis x-ray peaks for a c-axis-oriented film is ideally zero, and preferably much less than 1%. In addition, the c-axis-oriented grains should also be in-plane oriented, meaning that they are in registry with each other and with the substrate crystal structure. Grains that are rotated with respect to the overall in-plane lattice structure lead to nonzero-degree angle grain boundaries. The superconducting transport across such nonzero-angle grain boundaries, in particular high-angle grain boundaries and 45° grain boundaries, is degraded likely due to strain, the high oxygen mobility, and small coherence length of (RE)BCO (B. H. Moeckly et al., Phys. Rev. B 47, 400 (1993). $J_c$, $R_s$, and the RF nonlinearities may all be adversely affected by the presence of these high-angle grain boundaries. The presence of these rotated grains and grain boundaries may be detected by φ-scan x-ray measurements taken about an appropriate Bragg angle. Ideally, the amount of nonaligned φ-scan peaks should be zero, and preferably less than 0.1% of the magnitude of the aligned peaks, more preferably less than 0.05%, and most preferably less than 0.02%.

Figure 2:
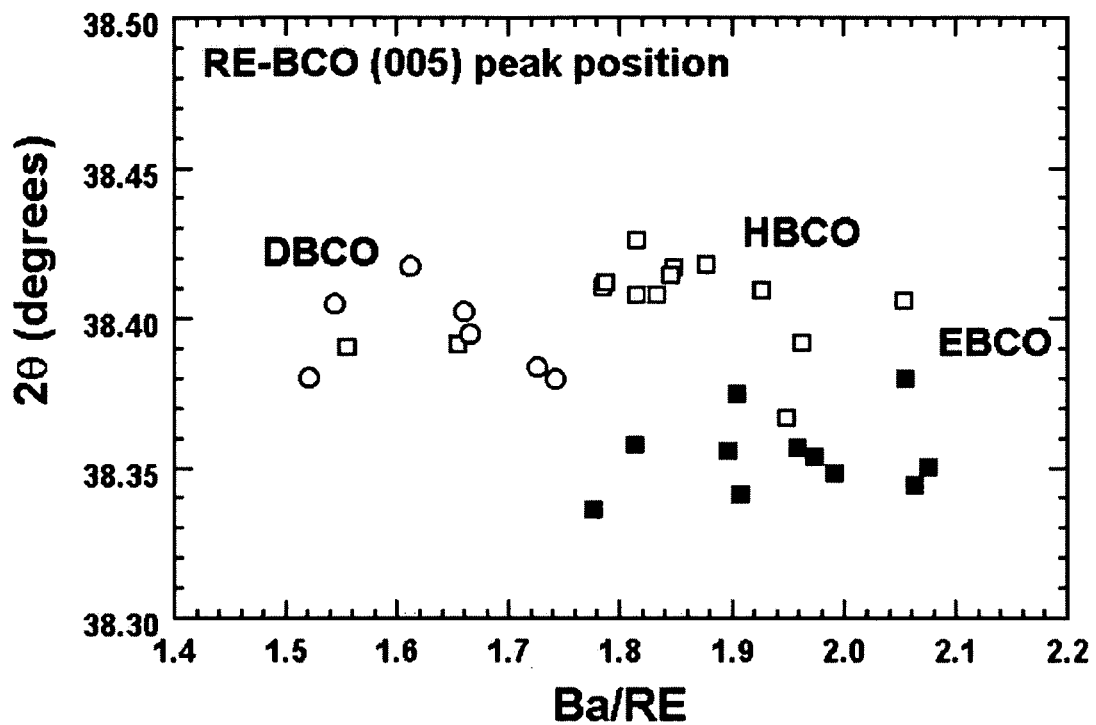
FIG. 2 displays the 2θ (005) x-ray peak positions as a function of the Ba/RE ratio for different compositions of the various (RE)BCO thin films indicated.
Figure 3:
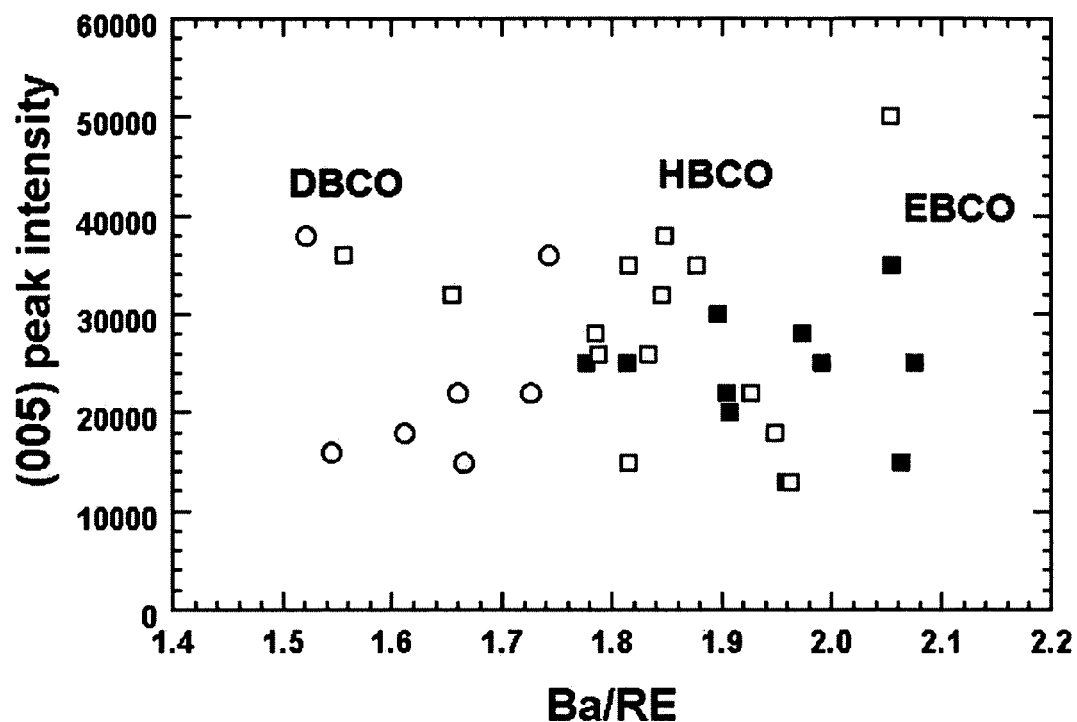
FIG. 3 displays the 2θ (005) x-ray peak intensities as a function of the Ba/RE ratio for different compositions of the various (RE)BCO thin films indicated.
Figure 4:
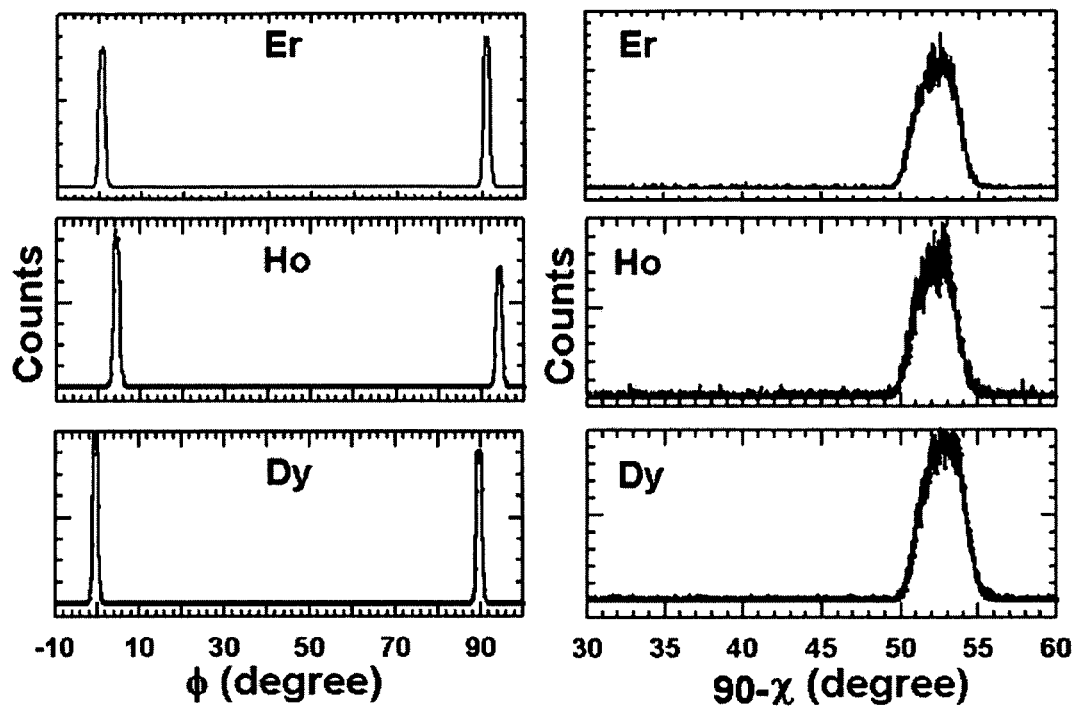
FIG. 4 shows representative x-ray diffraction φ-scans of the (103) peak for several (RE)BCO films, including Er-, Ho-, and Dy-BCO (left panels). The right panel plots display the α-scans for (RE)BCO films taken about the (104) peak.
Figure 5:
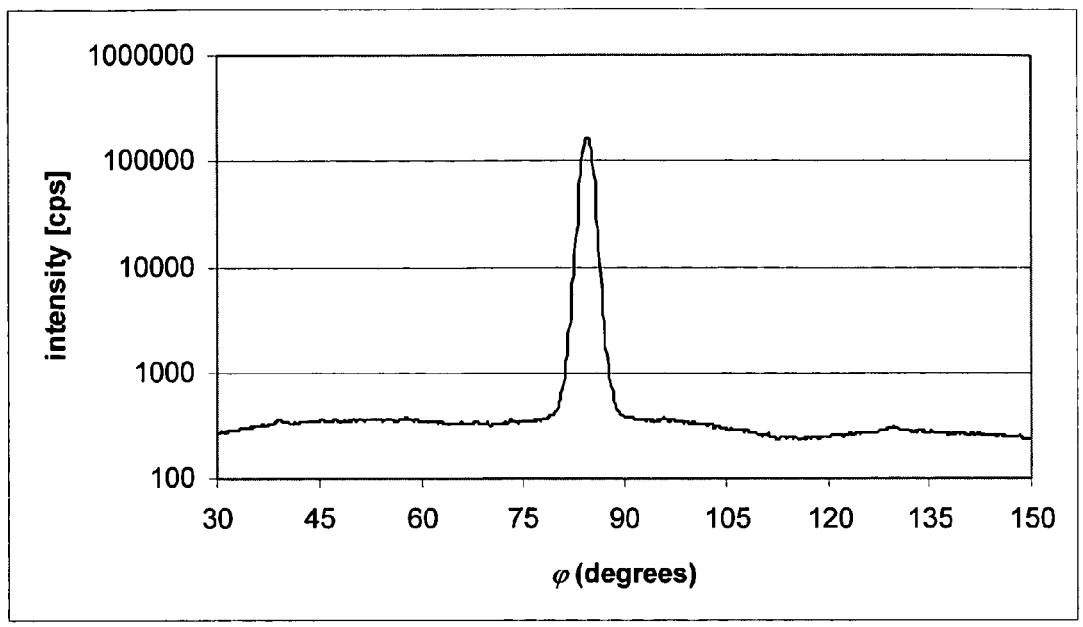
FIG. 5 shows a higher sensitivity φ-scan of the (103) Bragg angle for a Dy-BCO thin film.
Figure 31:
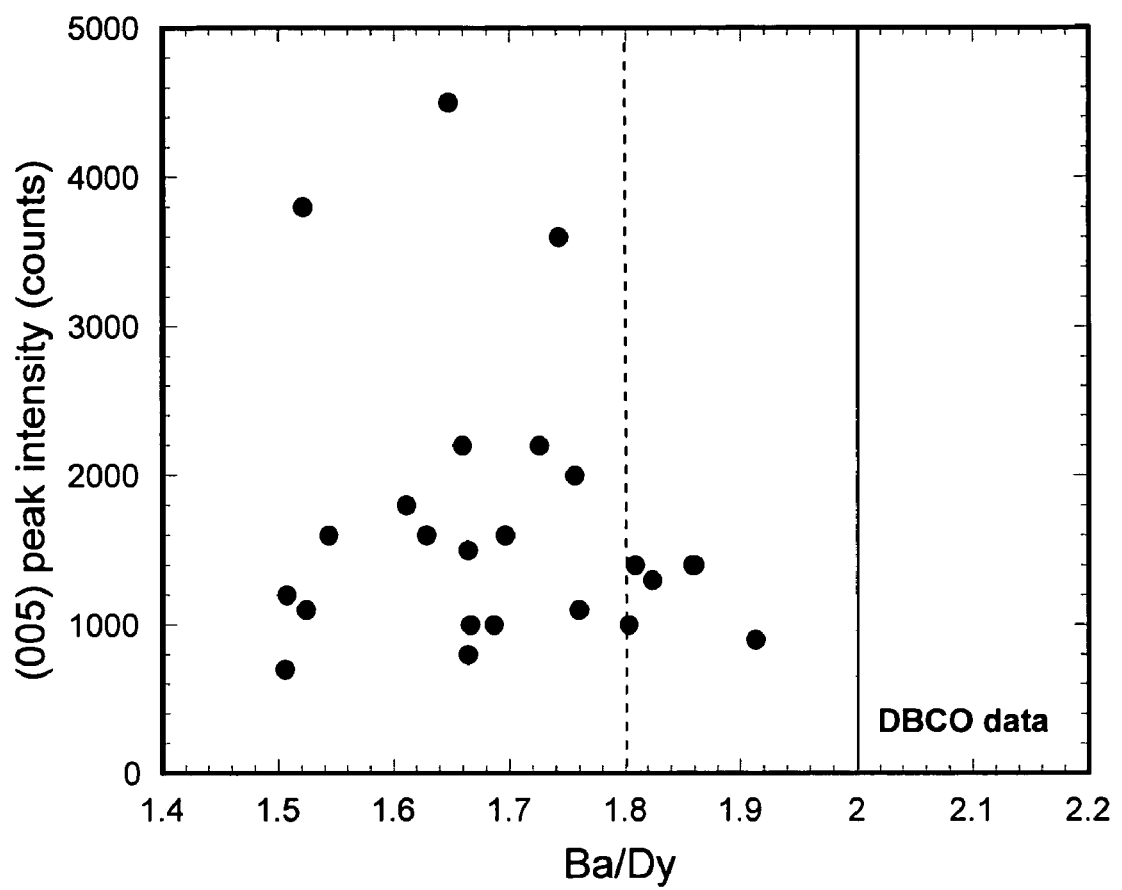
FIG. 31 displays the 2θ (005) x-ray peak intensities as a function of the Ba/Dy ratio for different compositions of Dy-BCO thin films.

FIG. 1 shows the θ-2θ scans for several 700-nm-thick (RE)BCO films made by us and optimized for RF applications. In addition to YBCO, these films include RE substitutions of Er (EBCO), Ho (HBCO), Dy (DBCO), and Nd (NBCO). The x-ray scans display the presence of only (001) peaks, indicating that the films are single-phase and highly c-axis aligned, and that no a-axis-oriented grains exist in the films. Note that the relative peak intensities of the (RE)BCO films are different from YBCO, indicative of the effect of the different RE ionic radii. FIG. 2 shows the (005) peak positions vs. the Ba/RE ratio for several (RE)BCO films with different compositions, indicating slightly different c-axis lattice parameters for these films. FIG. 3 shows the intensities of the (005) peaks for these films. FIG. 31 shows the intensities of the (005) peaks for DBCO films of varying compositions as a function of the Ba/Dy ratio. These DBCO films are inclusive of those shown in FIG. 3, but are not necessarily optimized for RF properties. Here, it is observed that high peak intensities, indicative of good crystallinity, are obtained for DBCO film compositions that deviate significantly from the on-stochiometric ratio indicated by the solid line on the graph. FIG. 4 shows representative φ-scans of the (103) peak for several (RE)BCO films (left hand panels). Note that any peaks at 45° are absent, indicating an absence of 45° oriented grains and grain boundaries. FIG. 5 shows a higher sensitivity φ-scan for one of our Dy-BCO films. The y-axis is plotted on a log scale, and it can be seen that only very weak peaks occur at 45° relative to the main peak. This scan indicates the degree to which this film is free from high-angle grain boundaries. The intensity of the weak lines at 45° is only about 0.012% of the maximum central peak indicating that almost none of the grains are misaligned. This is important for optimization of the RF properties of these films, most notably their RF non-linearities. The right-hand panel of FIG. 4 displays the X-scans for (RE)BCO films taken about the (104) peak; as indicated in FIG. 1, these scans also demonstrate the absence of a-axis-oriented grains.

The surface morphology of (RE)BCO thin films is typically measured by scanning probe profilometry, atomic force microscopy (AFM), and scanning electron microscopy (SEM). In general, smooth films are preferred for applications, though some degree of surface roughness may be tolerated in deference to the optimization of other important properties such as $J_c$ and $R_s$. Still, it is desirable to have an RMS surface roughness as determined by AFM, say, which is less than ~10 nm.

Figure 6:
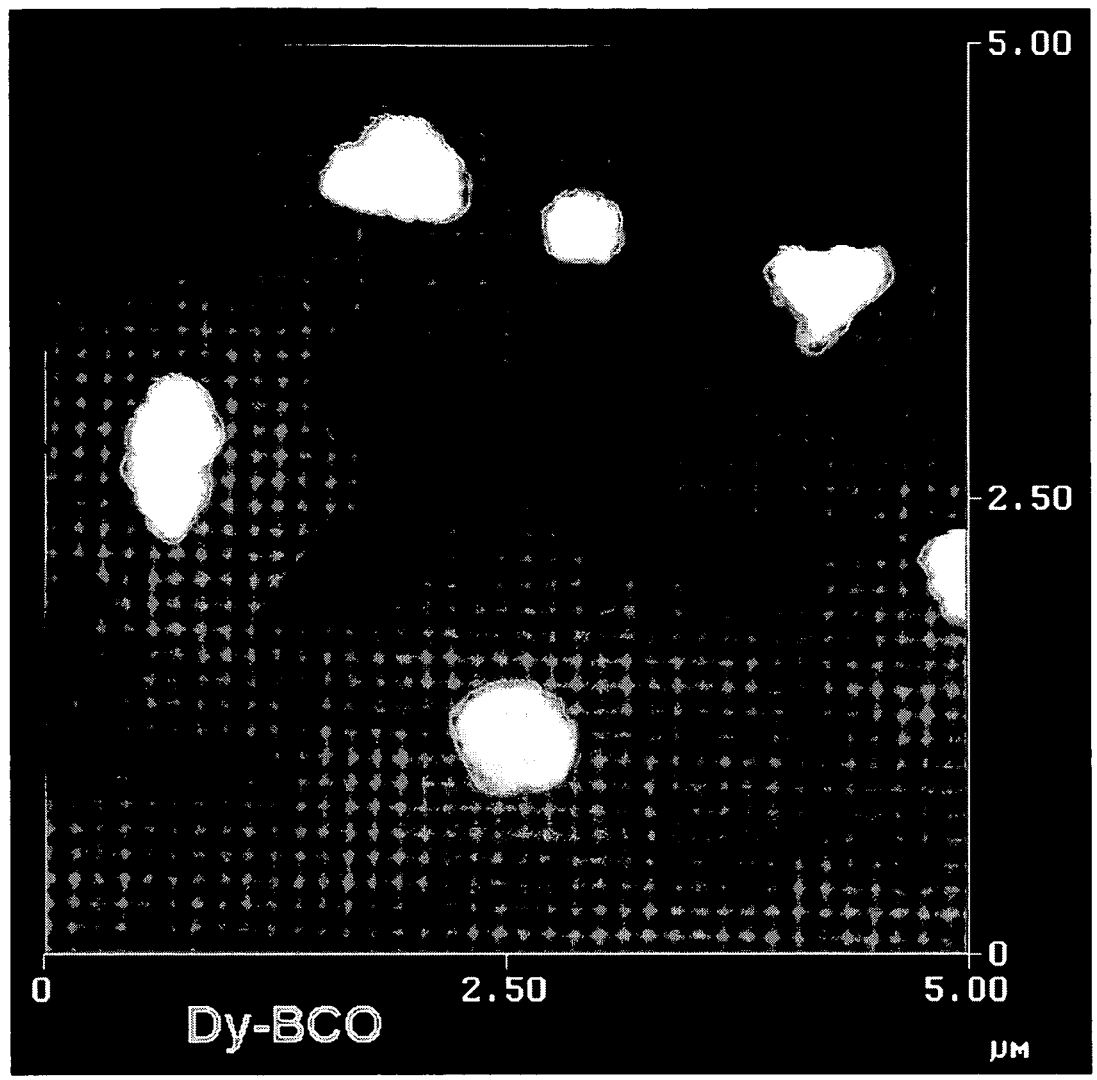
FIG. 6 shows an atomic force microscope (AFM) scan of the surface of a Dy-BCO thin film that is optimized for RF properties.
Figure 7:
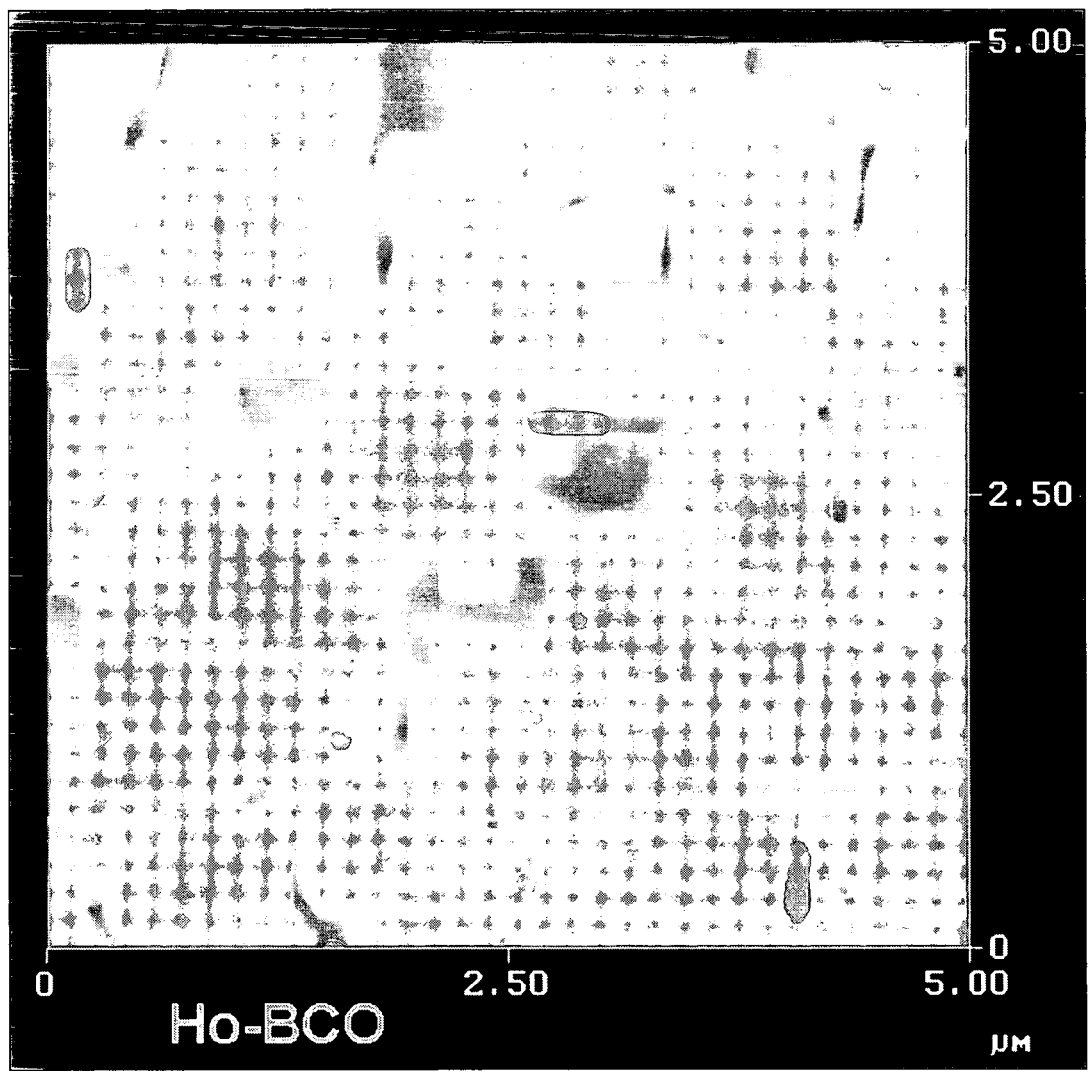
FIG. 7 shows an AFM scan of the surface of a Ho-BCO thin film that is optimized for RF properties.
Figure 8:
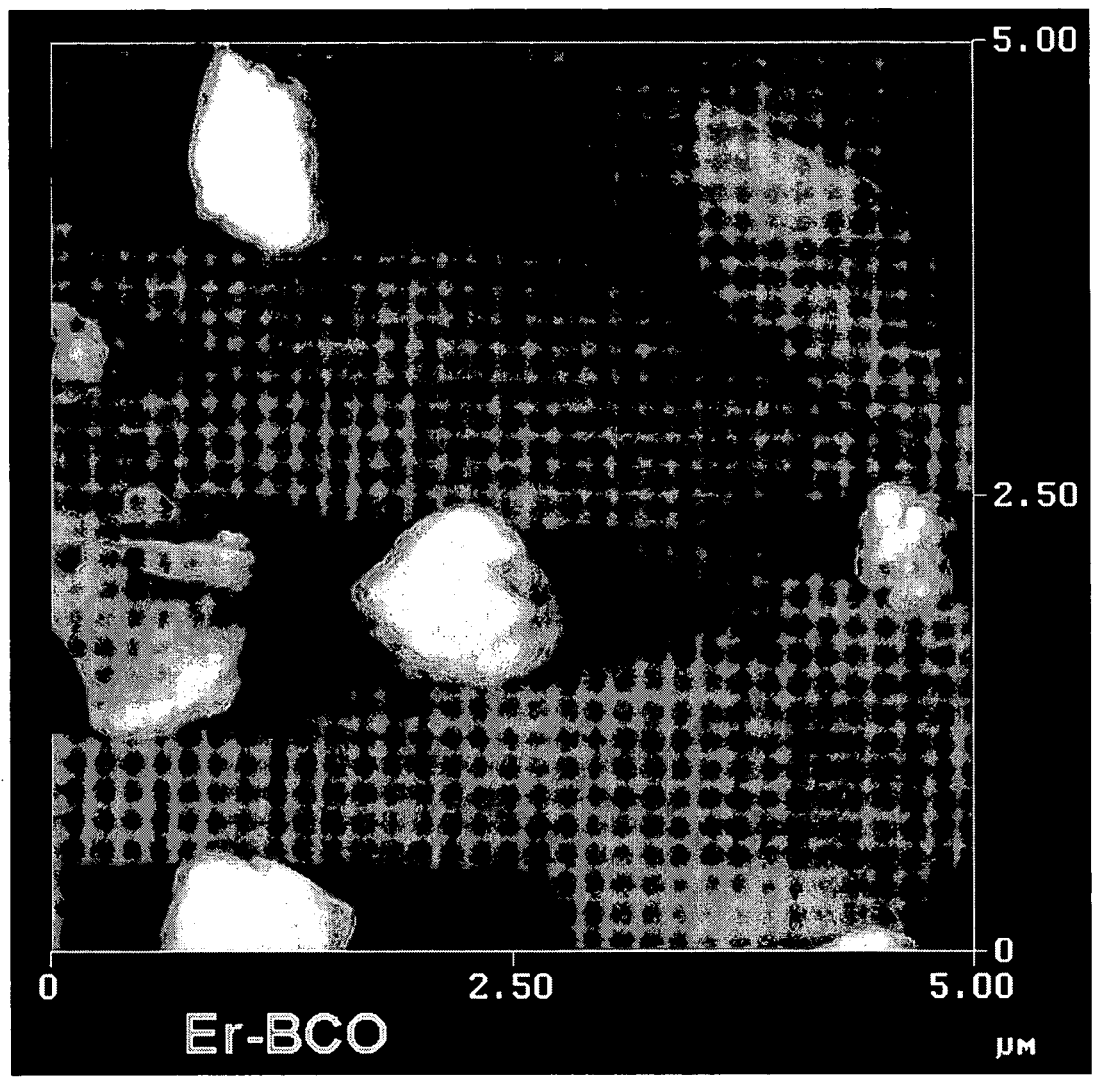
FIG. 8 shows an AFM scan of the surface of a Er-BCO thin film that is optimized for RF properties.
Figure 9:
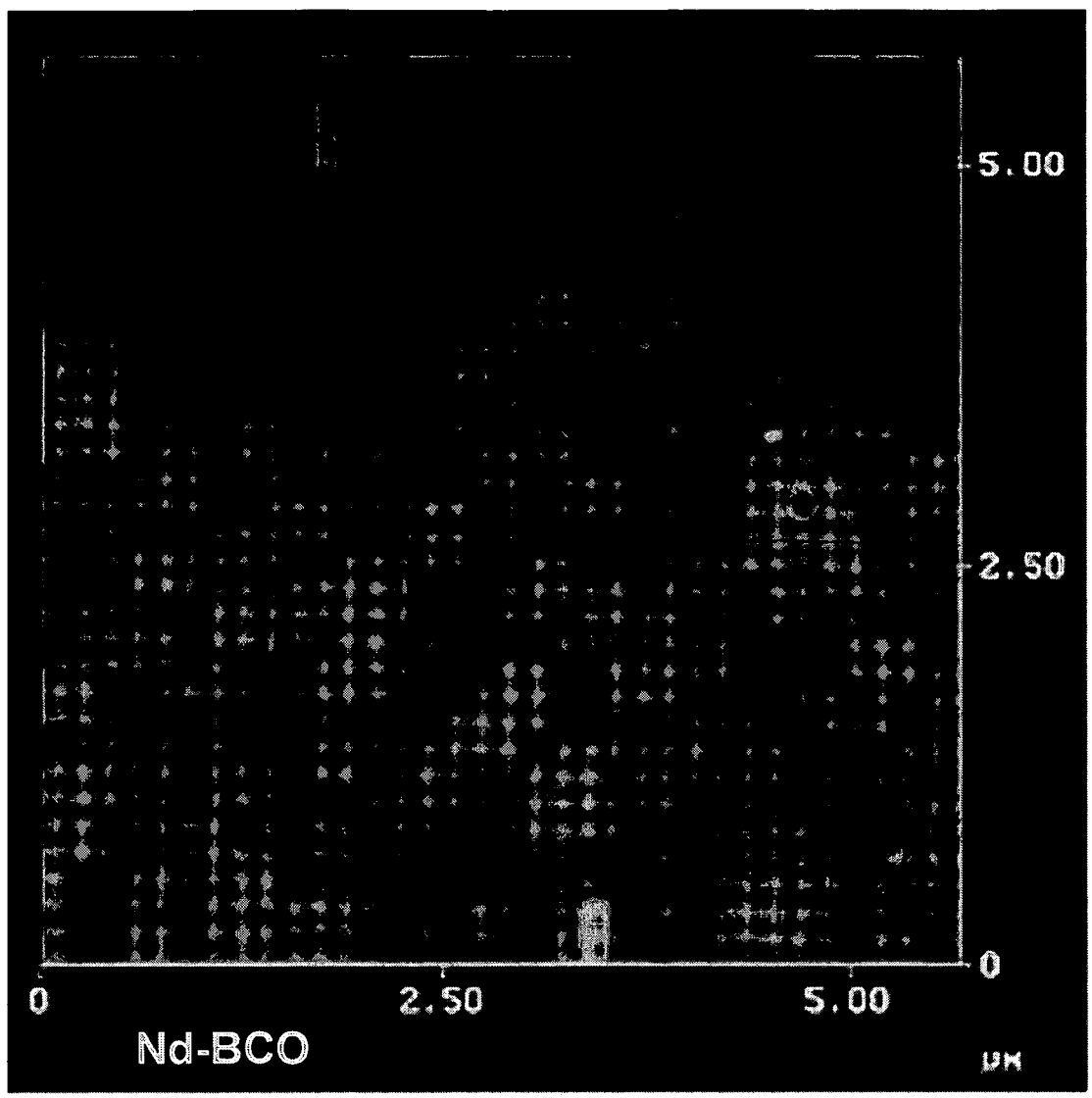
FIG. 9 shows an AFM scan of the surface of a Nd-BCO thin film that is optimized for RF properties.

FIGS. 6-9 show typical AFM images of Dy-, Ho-, Er-, and Nd-BCO films over a 5 μm×5 μm area. These films have been optimized in terms of their RF properties. The RMS surface roughness for these films is a few nm. FIG. 6 shows the surface morphology for a high-Q DBCO film with very low RF nonlinearities. The grain size of this film can be seen to be roughly 2 μm in diameter. We also observe some sub-micrometer-sized particles on the surface of the films, seen as the bright dots in the figure. EDX analysis indicates a high Cu signal for these particles, implying that they composed of Cu oxide. The grains for the HBCO film of FIG. 7 have a smaller, squarer appearance, and this film has a general absence of CuO particulates. The optimized EBCO surface depicted in FIG. 8 has a smaller grain size still, and in this case there also exist CuO particulates. The grains of the NBCO film of FIG. 9 are also square in appearance and have a size of less than 0.5 μm. The different surface morphologies for these optimized (RE)BCO films are in general reflections of the different composition and growth conditions needed to achieve the best RF properties for the different RE substitutions.

Film Characterization Methodology

The (RE)BCO films are further characterized by measuring their composition and their electrical properties, including the dc resistivity (p) as a function of temperature [ρ(T)], $T_c$ value and transition width, critical current density ($J_c$), and RF surface resistance ($R_s$). The films are also subsequently patterned into RF circuits for which we measure the unloaded quality factor (Q) values, intermodulation distortion (IMD), and nonlinear critical current density ($J_{IMD}$).

The composition of the films of this invention was measured using Rutherford backscattering spectrometry (RBS) and inductively coupled plasma spectroscopy (ICP). These techniques are both capable of a high degree of accuracy and precision, though achieving a measurement accuracy of 1σ or 2σ equal to 1% is a difficult task and requires more care than is the norm for these techniques. In the RBS analysis technique, fast, light ions (typically He ions or alpha particles) are accelerated toward the sample; some of these ions are backscattered due to Rutherford (Coulomb) scattering from atomic nuclei within the sample, and the energy spectrum of those backscattered particles is analyzed. The ion energies are typically in the range of several hundred to several thousand keV, and the energy of a backscattered ion depends on the mass of the target atom with which it has collided. Thus, the energy spectrum of the backscattered ions allows identification of the elements comprising the sample and their ratios (stoichiometry). In addition, as the incident ions traverse the sample, they lose energy due to inelastic scattering with electrons. This energy loss occurs in a known way and therefore allows determination of sample composition as a function of depth. However, for thick films, the spectral peaks of the measured constituent elements can overlap, requiring careful fitting of the spectra to extract the composition, and this procedure involves uncertainty and can introduce error. Therefore, in order to obtain the highest accuracy by simply counting the number of counts under each peak, sufficiently thin films must be used so that the peaks due to RE, Ba, and Cu can be completely separated. We have grown sufficiently thin (RE)BCO films for this purpose, and the results of these measurements have shown a compositional accuracy of $2\sigma \leq \pm 1\%$. Note that this measurement technique is quantitative and does not require the use of a comparison standard.

In the ICP technique, the thin films are digested in an acidic solution which is then introduced into a high-temperature (up to 10,000° C.) plasma discharge. The plasma ionizes and excites the constituent atoms in the solution, and as these atoms decay to a lower energy state, they emit light of a characteristic wavelength that can be detected by a high-resolution spectrometer. This is the so-called ICP-AES (atomic emission or optical emission spectroscopy) technique. ICP hence permits measurement of multiple elements simultaneously. ICP-AES has detection limits typically at the μg/L level in aqueous solutions. This technique can be very accurate and precise; an accuracy of $1\sigma < \pm 1\%$ is obtainable with careful measurement. The method requires the use of a comparison standard. It does not have an accuracy limitation as a function of thin film thickness, however, as does RBS. Hence in testing our compositions, we have used RBS and ICP together. First, we have made careful RBS measurements on very thin films in order to determine their composition to a high degree of accuracy. We have then confirmed that the ICP measurements on these same samples agree with the RBS numbers. This allows us to have confidence that the ICP-AES measurement of thicker (RE)BCO films shares this same degree of desired accuracy, i.e., $1\sigma < \pm 1\%$.

Figure 10:
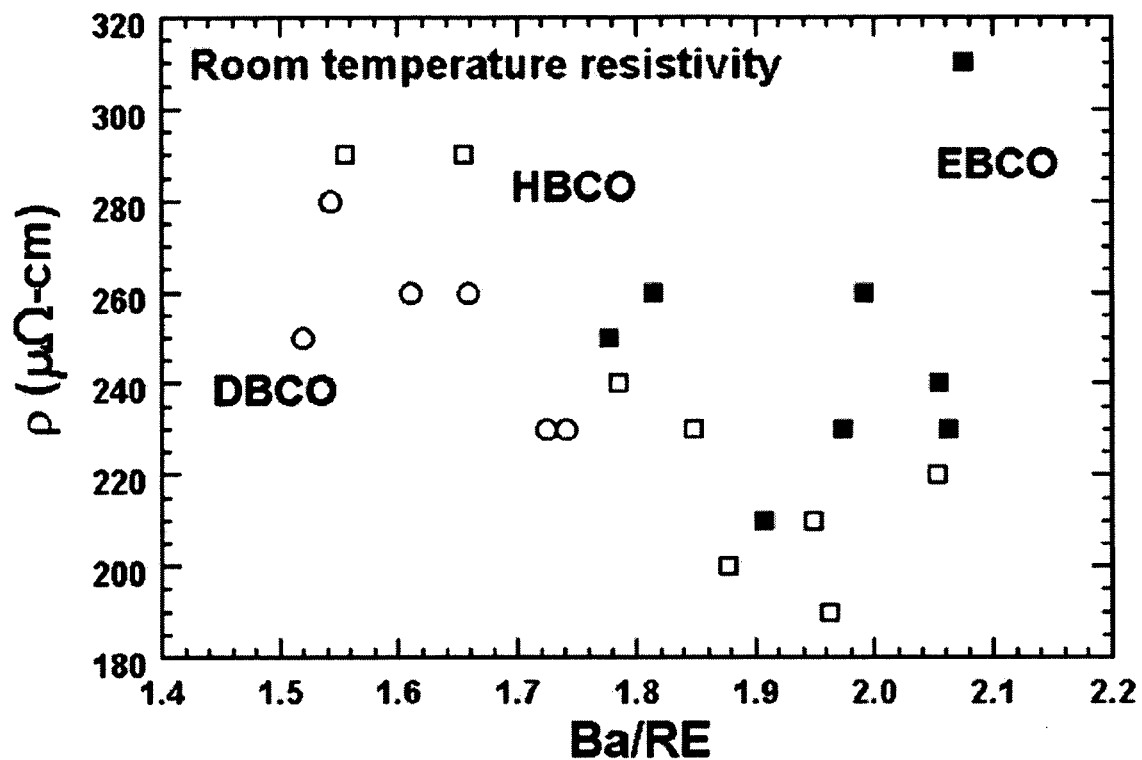
FIG. 10 displays the room-temperature (300 K) dc resistivity values as a function of the Ba/RE ratio for different compositions of the various (RE)BCO thin films indicated.
Figure 11:
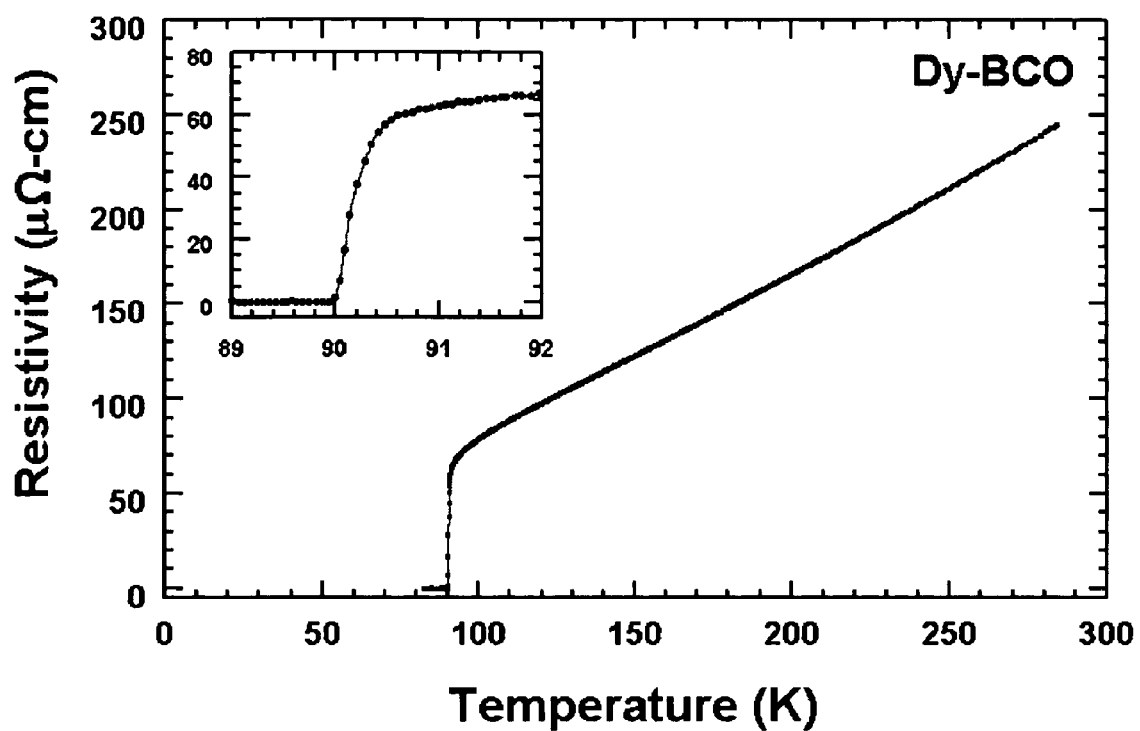
FIG. 11 shows the dc resistivity as a function of temperature, ρ(T), for a Dy-BCO film optimized for RF properties. A detail of the superconducting transition is shown in the inset.
Figure 12:
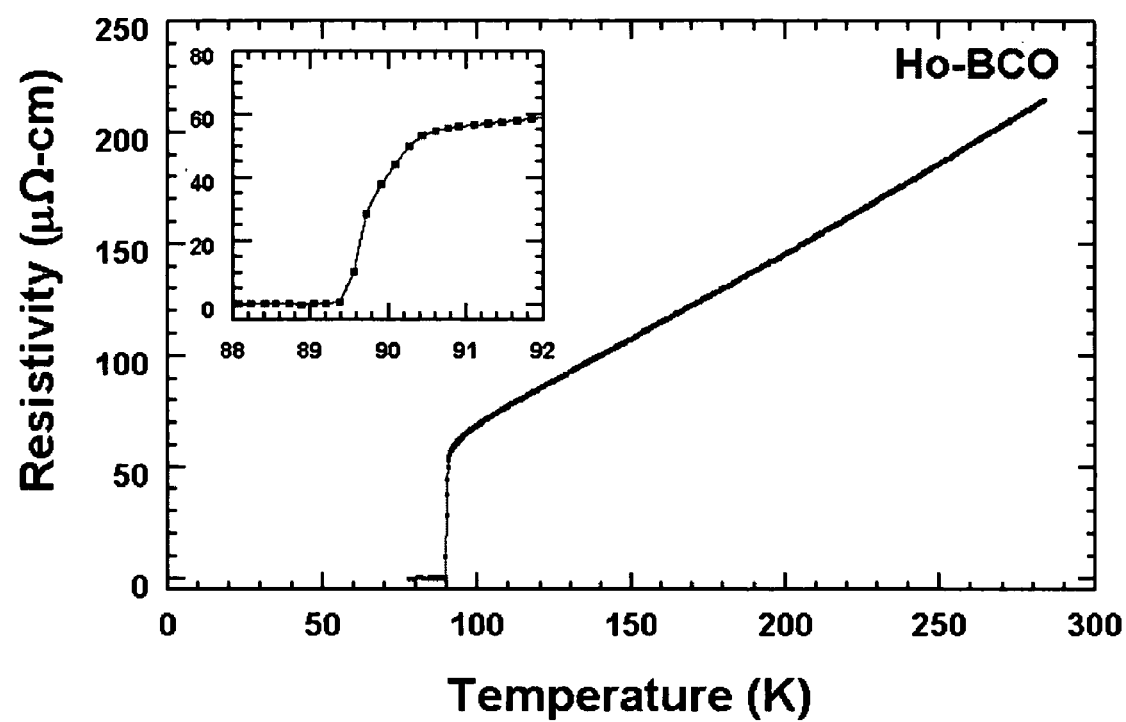
FIG. 12 shows the ρ(T) curve for a Ho-BCO film optimized for RF properties. A detail of the superconducting transition is shown in the inset.
Figure 13:
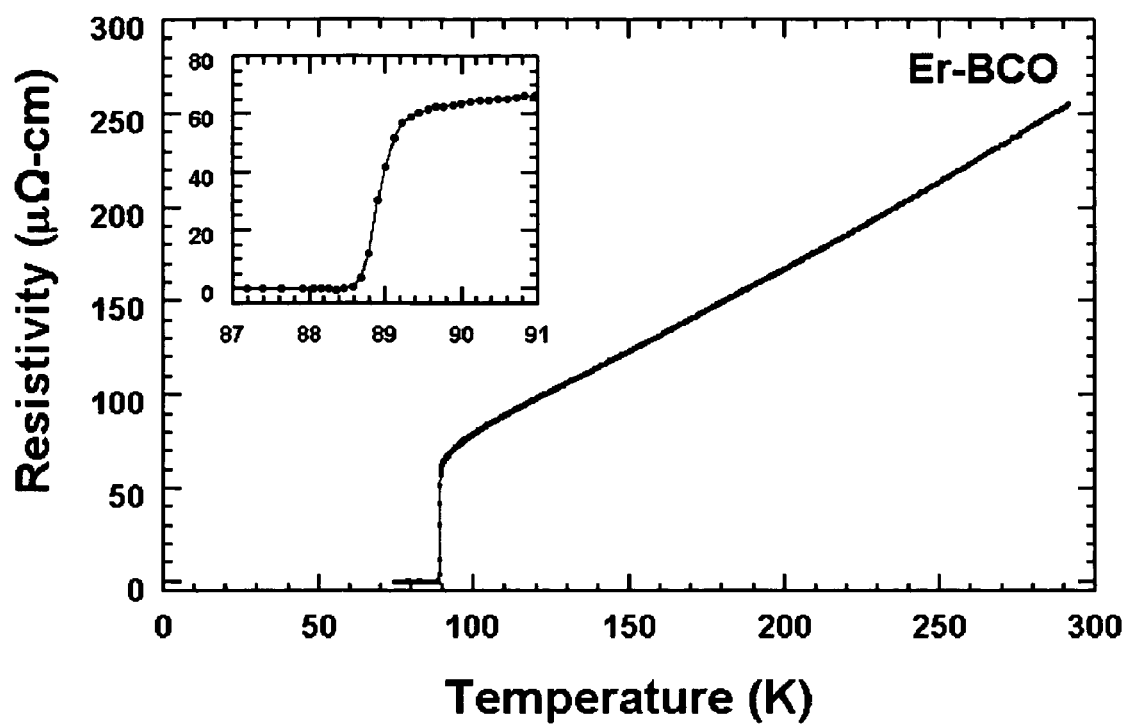
FIG. 13 shows the ρ(T) curve for a Er-BCO film optimized for RF properties. A detail of the superconducting transition is shown in the inset.
Figure 14:
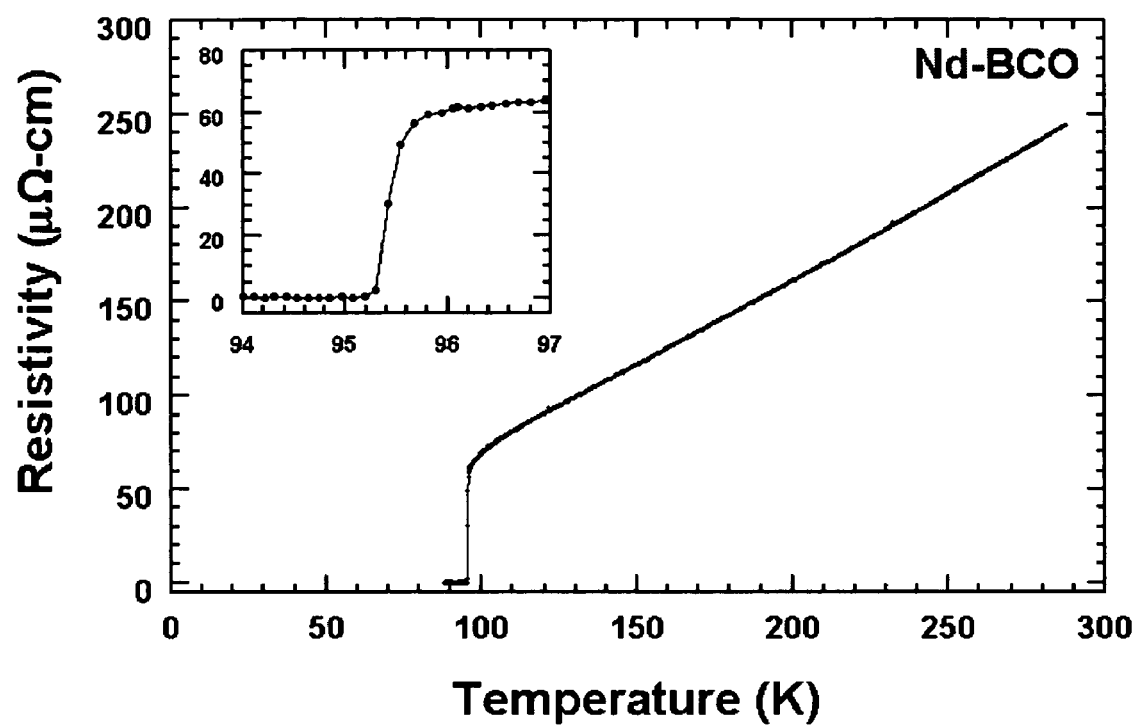
FIG. 14 shows the ρ(T) curve for a Nd-BCO film optimized for RF properties. A detail of the superconducting transition is shown in the inset.
Figure 32:
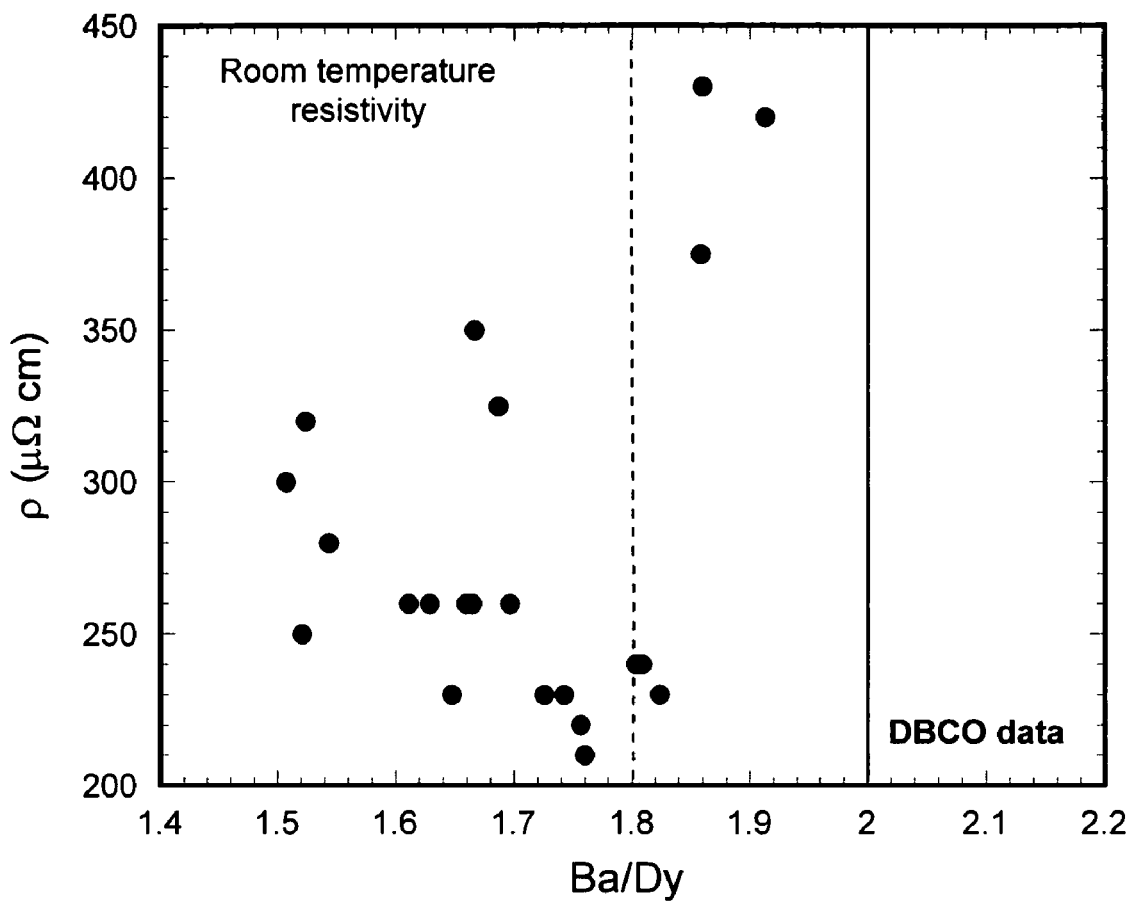
FIG. 32 displays the room-temperature (300 K) dc resistivity values as a function of the Ba/Dy ratio for different compositions of Dy-BCO thin films.

The dc resistivity p is measured by a standard four-point-probe technique. The room-temperature resistivity of high-quality (RE)BCO films is typically between 150 and 300 μΩcm, though this value varies as a function of RE element and of film composition. FIG. 10 shows the room-temperature (300 K) resistivity values of several (RE)BCO films as a function of composition, specifically the Ba/RE ratio. FIG. 32 shows the room-temperature resistivity values for several DBCO films as a function of the Ba/Dy ratio. These DBCO films are inclusive of those shown in FIG. 10, but are not necessarily optimized for RF properties Here, it is observed that the room temperature resistivity values indicative of high quality films are obtained for DBCO film compositions that deviate significantly from the on-stochiometric ratio (indicated by the solid line on the graph), particularly within Ba/Dy ratios ranging between about 1.5-1.8, with particularly good resistivity values achieved for a Ba/Dy ratio of 1.76. The temperature dependence of the resistivity is shown in FIGS. 11-14 for several (RE)BCO films. The temperature dependence of ρ for good films is typically linear or slightly downwardly bowed indicative of so-called overdoped behavior, as these plots indicate. The measurement of ρ(T) is also used to determine both the width (in temperature) of the transition to the superconducting state and the zero-resistance $T_c$ value. The detail of the superconducting transition region of these films is shown in the inset of FIGS. 11-14. The $T_c$ values for (RE)BCO films are typically between 87 and 91 K (FIGS. 11-13), though the higher ionic radius RE substitutions may have $T_c$ values as high as 95 K, as shown for the NBCO film in FIG. 14. The transition from the normal state to superconducting state typically occurs within 0.5 K for high quality films, as the figures indicate.

Figure 15:
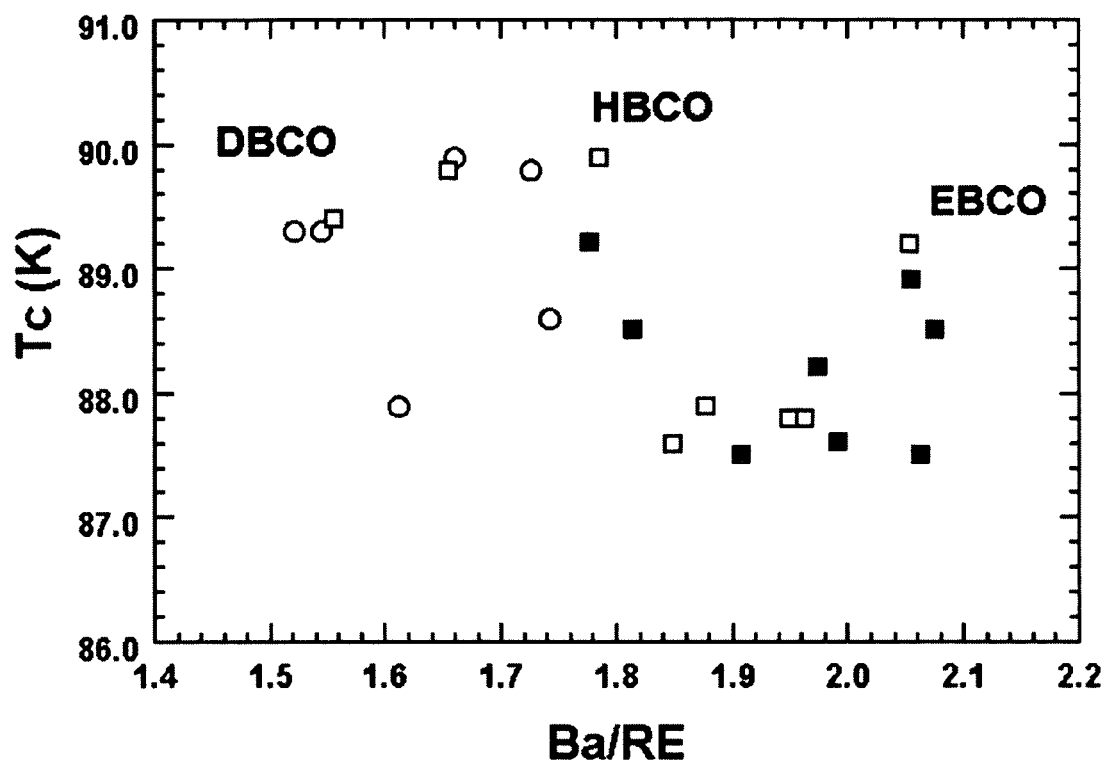
FIG. 15 displays the zero-resistance $T_c$ values as a function of the Ba/RE ratio for different compositions of the various (RE)BCO thin films indicated.
Figure 33:
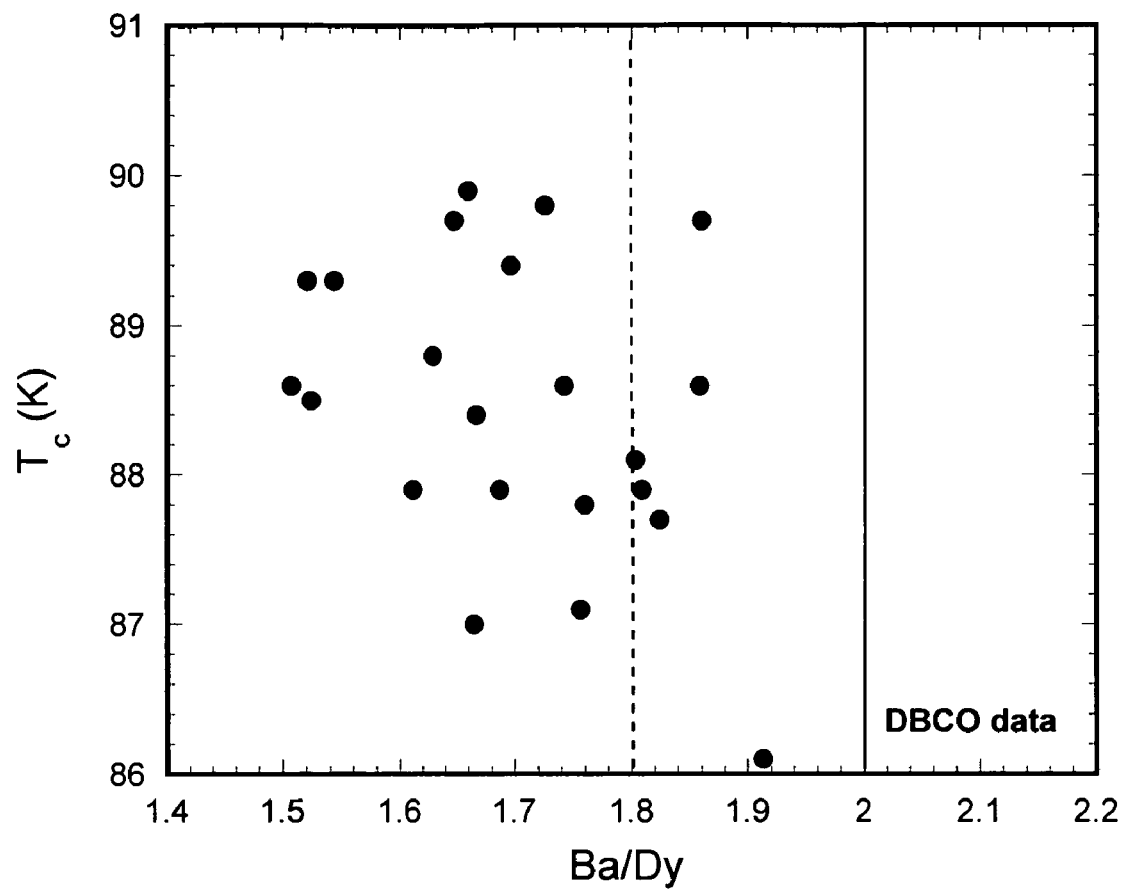
FIG. 33 displays the zero-resistance $T_c$ values as a function of the Ba/Dy ratio for different compositions of Dy-BCO thin films.

The $T_c$ values of the (RE)BCO samples prepared by the process of this invention are 88.5(5), 88.9(5), 89.2(5), 89.6(5), and 94.5(8) K for Er, Y, Ho, Dy, and Nd, respectively. These values were measured immediately following deposition. Since the films are oxygen overdoped as judged by the slope of the R-T curves, the measured $T_c$ values are slightly lower than the highest values known for these compounds. FIG. 15 plots the $T_c$ values for different compositions of our Ho-, Er-, and Dy-BCO films. FIG. 33 plots the $T_c$ values for different compositions of additional DBCO films. These DBCO films are inclusive of those shown in FIG. 15, but are not necessarily optimized for RF properties. It can be seen that high $T_c$ values are obtained even for compositions deviating substantially from the on-stoichiometric (1:2:3) value, indicated by the solid vertical line.

The RF surface resistance of (RE)BCO thin films may be measured in a number of ways, including cavity or parallel plate resonator techniques using bulk (unpatterned) films. $R_s$ is typically measured at frequencies between a few hundred MHz and 10 s of GHz. $R_s$ may also be extracted from the Q measurements of patterned resonators of various kinds, e.g., microstrip, quasi-lumped element, etc. Extraction of $R_s$ from the measured Q values of these structures requires careful modeling of the resonator performance to determine the geometric parameter $\Gamma_Q$. The relationship between $R_s$ and Q can be written as $$R_s = \omega_0 \Gamma_Q \frac{1}{Q}$$

where w0 is the resonant frequency, $\Gamma_Q$ is a parameter that depends only on the resonator geometry, and Q is the measured unloaded quality factor of the resonator. The extracted $R_s$ value of patterned structures is typically higher than the $R_s$ value obtained by direct measurement of the bulk films in an RF cavity. This may be caused by patterning the film, which may introduce defects that can add additional resistive RF losses in the Q measurement. It may also arise from uncertainties in $\Gamma_Q$ or the non-uniformity of the current density in microstrip resonators which is generally not present in bulk film measurement systems.

Device Performance Characterization

Figure 16:
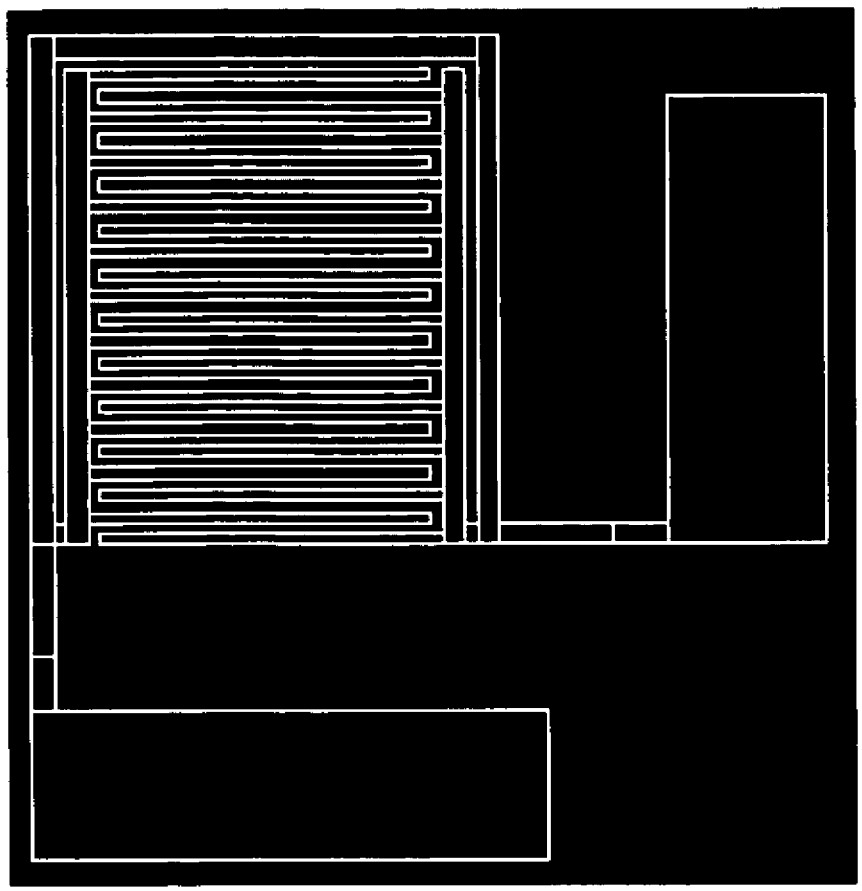
FIG. 16 shows the geometry of the quasi-lumped element resonator design used to measure the Q values of our (RE)BCO films. This resonator has a center frequency of about 1.85 GHz for films on MgO substrates. The resonator dimensions are 5.08-mm square.

For evaluation of the RF properties of our (RE)BCO films and for determining the utility of these materials for microwave filter applications, we have fabricated microwave resonators and filters from these films. These passive devices require a ground plane and hence necessitate depositing double-sided films. Quasi-lumped element resonators were patterned using standard photolithographic processing and inert ion etching. The geometry of our test resonator is shown in FIG. 16. The materials are characterized by measuring the unloaded quality factor, $Q_u$, of this standard test resonator which has a center frequency of about 1.85 GHz at 77 K for (RE)BCO resonators patterned on MgO substrates. The $Q_u$ was measured for a range of composition and growth conditions of each (RE)BCO material, and the growth conditions and composition of each material were optimized to achieve maximum $Q_u$. We have demonstrated $Q_u$ values that are sufficient for cellular microwave applications for Dy-BCO, Er-BCO, Ho-BCO and Nd-BCO thin films. Indeed, for 700-nm-thick films, we have achieved unloaded Q values over 40,000 at 1.85 GHz, 67 K, and −10 dBm input power for our test resonator structure using each of these materials. We subsequently extracted the $R_s$ value of the films by modeling the electromagnetic field distribution of the resonator geometry. Good $R_s$ values for microwave applications are less than ~15 $\mu\Omega$ at 1.85 GHz and 77 K, and more preferably less than ~10 $\mu\Omega$, and most preferably less than about 8 $\mu\Omega$.

Figure 17:
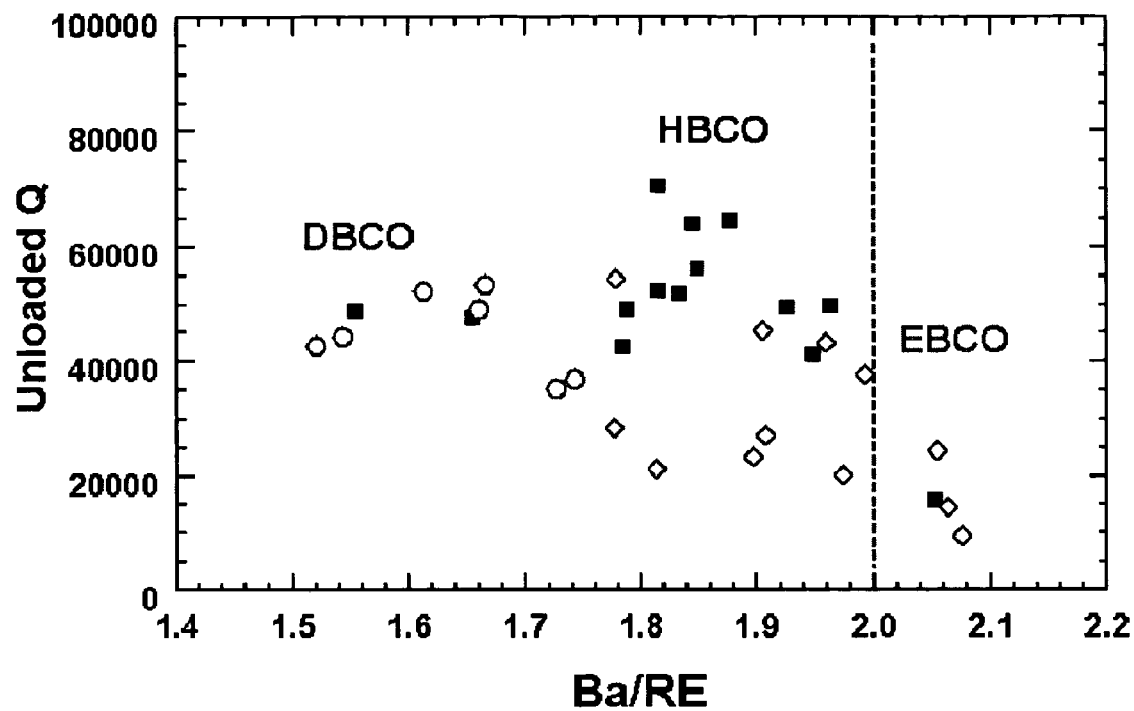
FIG. 17 displays the unloaded quality factor ($Q_u$) as a function of the Ba/RE ratio for different compositions of the various (RE)BCO thin films indicated. These $Q_u$ values were measured at a temperature of 67 K and input power of −10 dBm for lumped-element RF resonators having a center frequency of about 1.85 GHz. The dotted line at Ba/RE=2 represents the on-stoichiometric value of the 1:2:3 compound.
Figure 18:
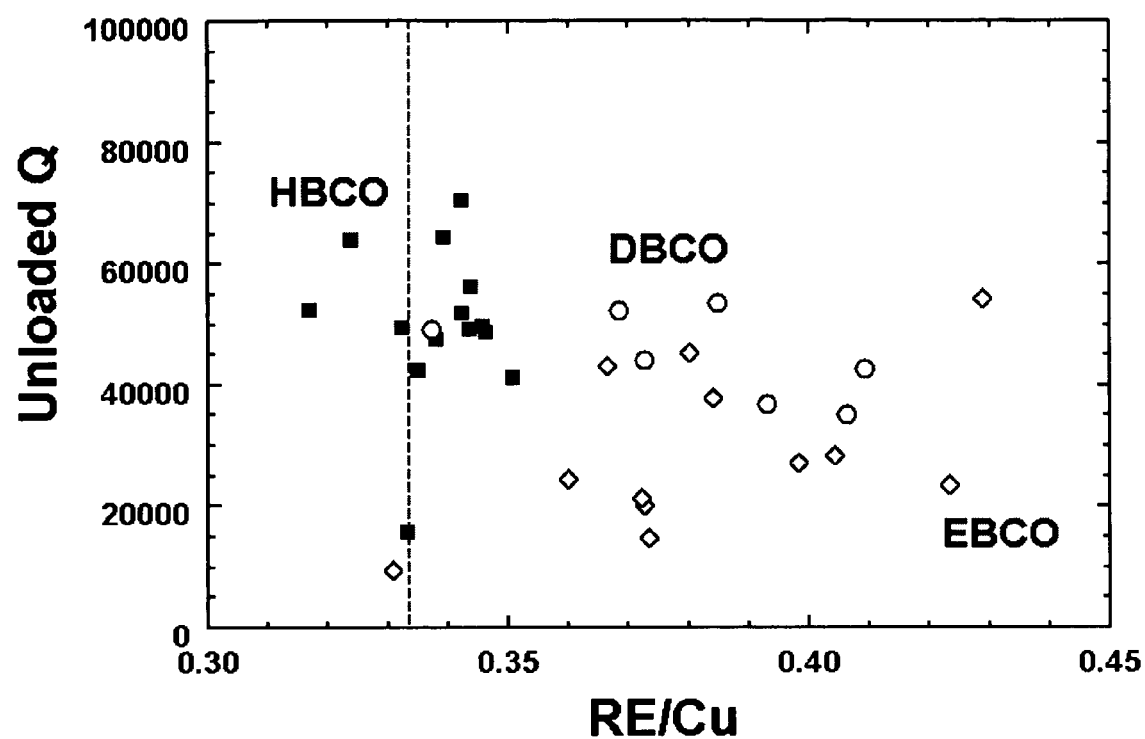
FIG. 18 displays the $Q_u$ values as a function of the RE/Cu ratio for different compositions of the various (RE)BCO thin films indicated. These $Q_u$ values were measured at a temperature of 67 K and input power of −10 dBm for lumped-element RF resonators having a center frequency of about 1.85 GHz. The dotted line at RE/Cu=⅓ represents the on-stoichiometric value of the 1:2:3 compound.
Figure 19:
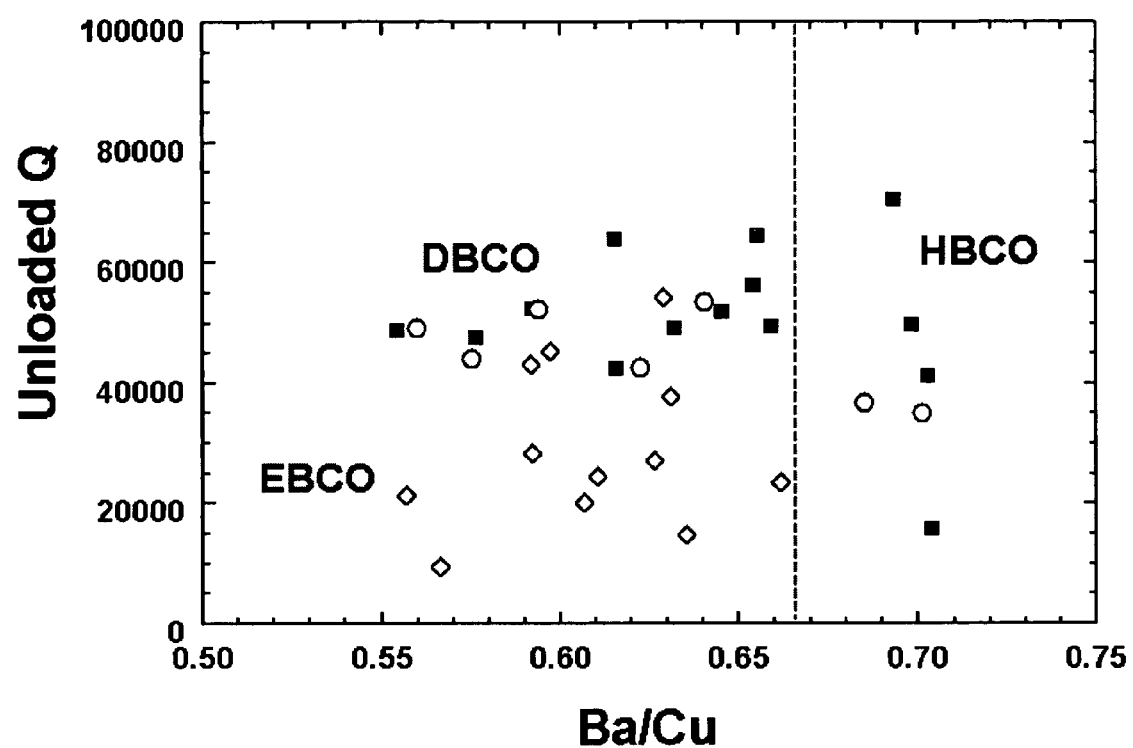
FIG. 19 displays the $Q_u$ values as a function of the Ba/Cu ratio for different compositions of the various (RE)BCO thin films indicated. These $Q_u$ values were measured at a temperature of 67 K and input power of −10 dBm for lumped-element RF resonators having a center frequency of about 1.85 GHz. The dotted line at Ba/Cu=⅔ represents the on-stoichiometric value of the 1:2:3 compound.

FIG. 17 shows the unloaded Q of our (RE)BCO lumped-element microwave resonators vs. the relative Ba/RE ratio. These measurements were made at 67 K and −10 dBm input power. The $Q_u$ values of these films are slightly lower than our highest Qs obtained with YBCO films. The dotted line at Ba/RE=2 represents the on-stoichiometric value of the 1:2:3 compound. It can be seen that the highest Q values are obtained away from this ratio. Our Nd-BCO films display higher $Q_u$ values at 67 K, reaching 80,000 (not shown on this plot), comparable to the highest Qs obtained with YBCO films. At 77 K, the Q values of Nd-BCO films can exceed those of YBCO. Although there is scatter in the data, the trend for all three materials shown in FIG. 17 is similar. There exists for each (RE)BCO film a value of the Ba:RE ratio for which the Q is maximal, and the Q values drop for ratios away from the maximum in a similar way for each RE element. FIG. 18 shows these $Q_u$ values measured as a function of the RE/Cu ratio, and FIG. 19 plots these data as a function of Ba/Cu. The dotted lines indicate the on-stoichiometric ratios of these quantities, and it is again observed that high Q values are obtained for compositions that deviate significantly from these nominal ratios. Table I displays the maximum $Q_u$ values obtained for test resonators made from our (RE)BCO films measured at 67 K and 77 K for an input power of −10 dBm. This table also shows the $R_s$ values that we have calculated from these $Q_u$ values.

Figure 27:
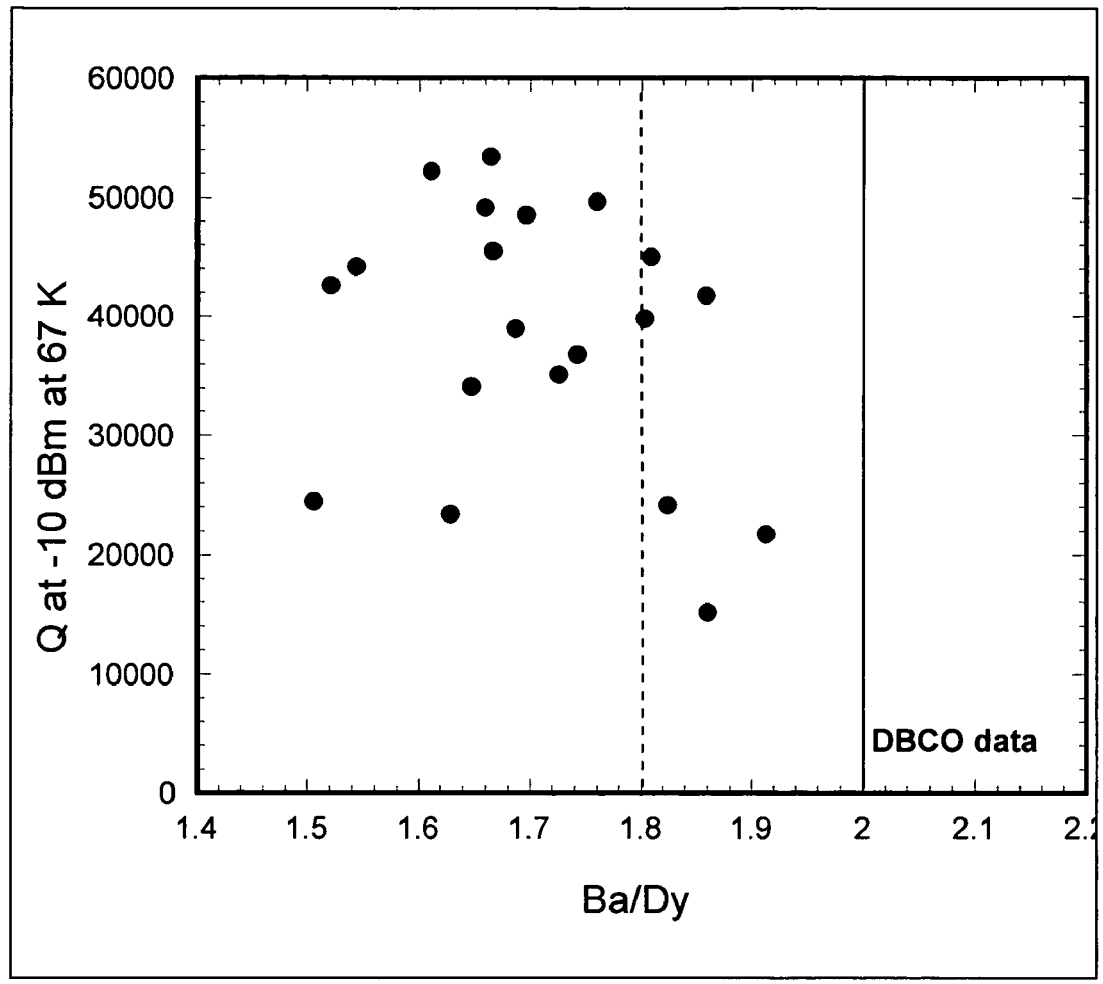
FIG. 27 displays the unloaded quality factor ($Q_u$) as a function of the Ba/Dy ratio for different compositions of the various Dy-BCO thin films indicated. These $Q_u$ values were measured at a temperature of 67 K and input power of −10 dBm for lumped-element RF resonators having a center frequency of about 1.85 GHz. The solid line at Ba/Dy=2 represents the on-stoichiometric value of the 1:2:3 compound.
Figure 28:
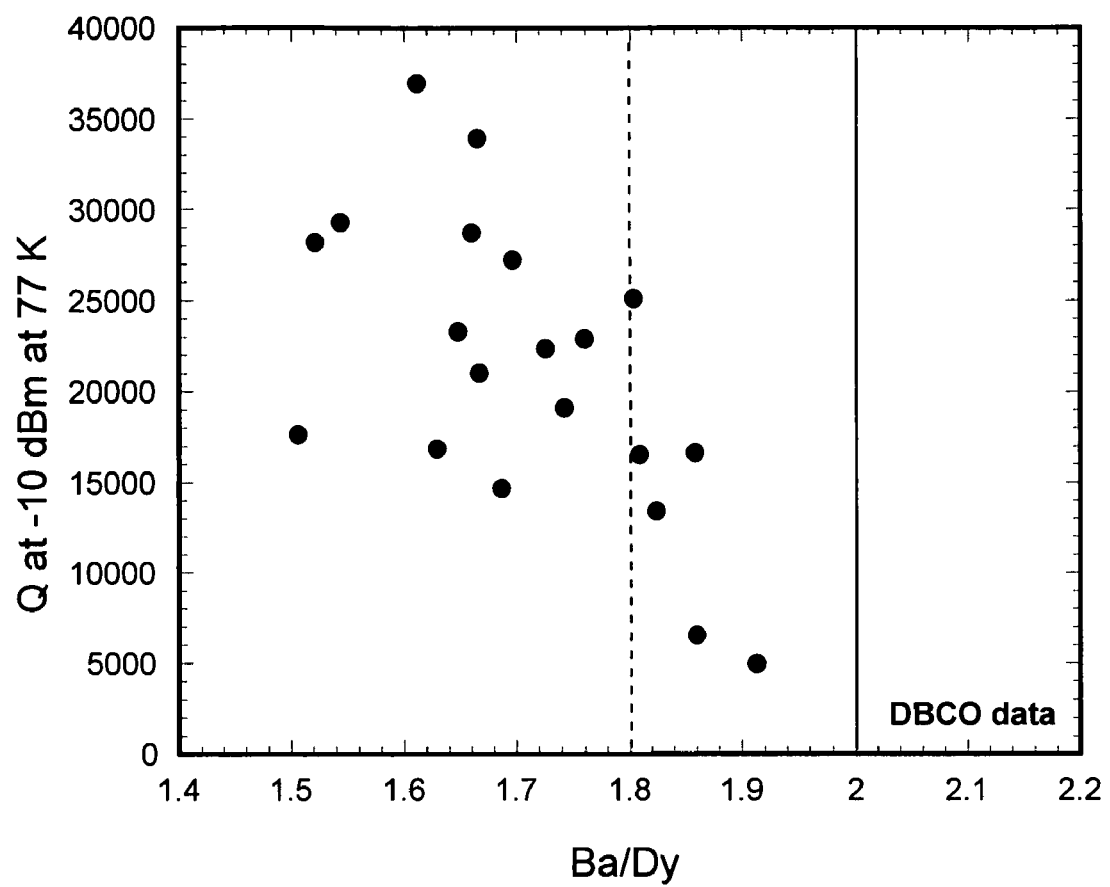
FIG. 28 displays the unloaded quality factor ($Q_u$) as a function of the Ba/Dy ratio for different compositions of the various Dy-BCO thin films indicated. These $Q_u$ values were measured at a temperature of 77 K and input power of −10 dBm for lumped-element RF resonators having a center frequency of about 1.85 GHz. The solid line at Ba/Dy=2 represents the on-stoichiometric value of the 1:2:3 compound.

FIG. 27 displays additional data on the unloaded quality factor ($Q_u$) as a function of the Ba/Dy ratio for different compositions of the various DBCO thin films indicated. These DBCO films are inclusive of those shown in FIG. 17, but are not necessarily optimized for RF properties. Hence whereas FIG. 17 represents the best Q values obtainable at each composition, FIG. 27 shows a range of Q values at each composition, because other properties of the films may not be optimized, e.g., growth temperature, film thickness, surface morphology, or crystallinity. These $Q_u$ values were measured at a temperature of 67 K and input power of −10 dBm for lumped-element RF resonators having a center frequency of about 1.85 GHz. The solid line at Ba/Dy=2 represents the on-stoichiometric value of the 1:2:3 compound. It is again observed that the highest Q values are obtained for compositions that deviate significantly from the on-stoichiometric ratio, particularly for Ba/Dy ratios between about 1.5-1.8, more particularly peaking at between about the 1.6-1.7 ratio. FIG. 28 displays the unloaded quality factor ($Q_u$) as a function of the Ba/Dy ratio for the same DBCO thin films of varying compositions measured at a temperature of 77 K and input power of −10 dBm. While there is more scatter in the data at this temperature which is nearer $T_c$, the data still clearly show that the highest Q values are obtained for compositions that deviate significantly from the on-stoichiometric ratio, particularly for Ba/Dy ratios between about 1.5-1.8, more particularly peaking around the 1.6 ratio.

Figure 29:
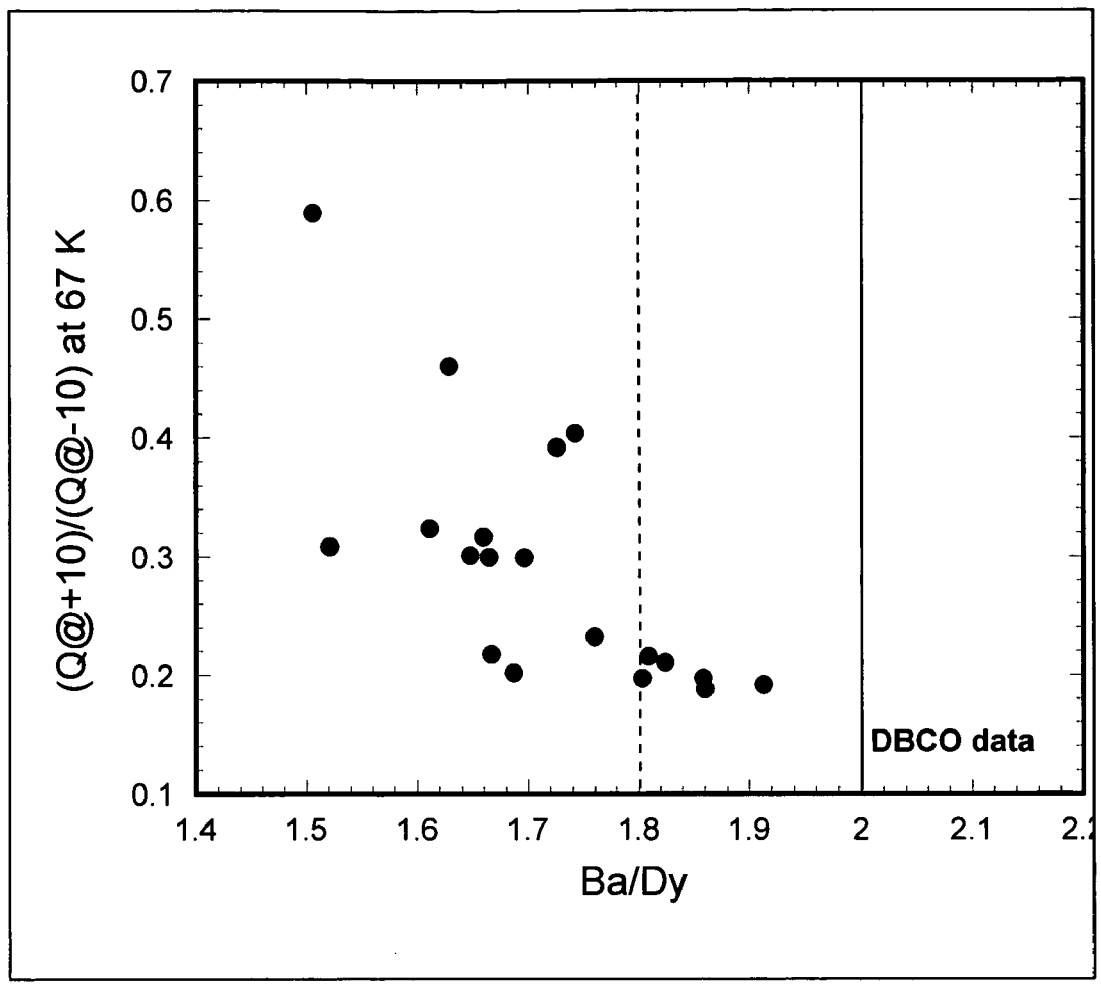
FIG. 29 displays the ratio of high input power (+10 dBm) to low input power (−10 dBm) Q factors for different compositions of the various Dy-BCO thin films indicated wherein the $Q_u$ values were measured at a temperature of 67 K.
Figure 30:
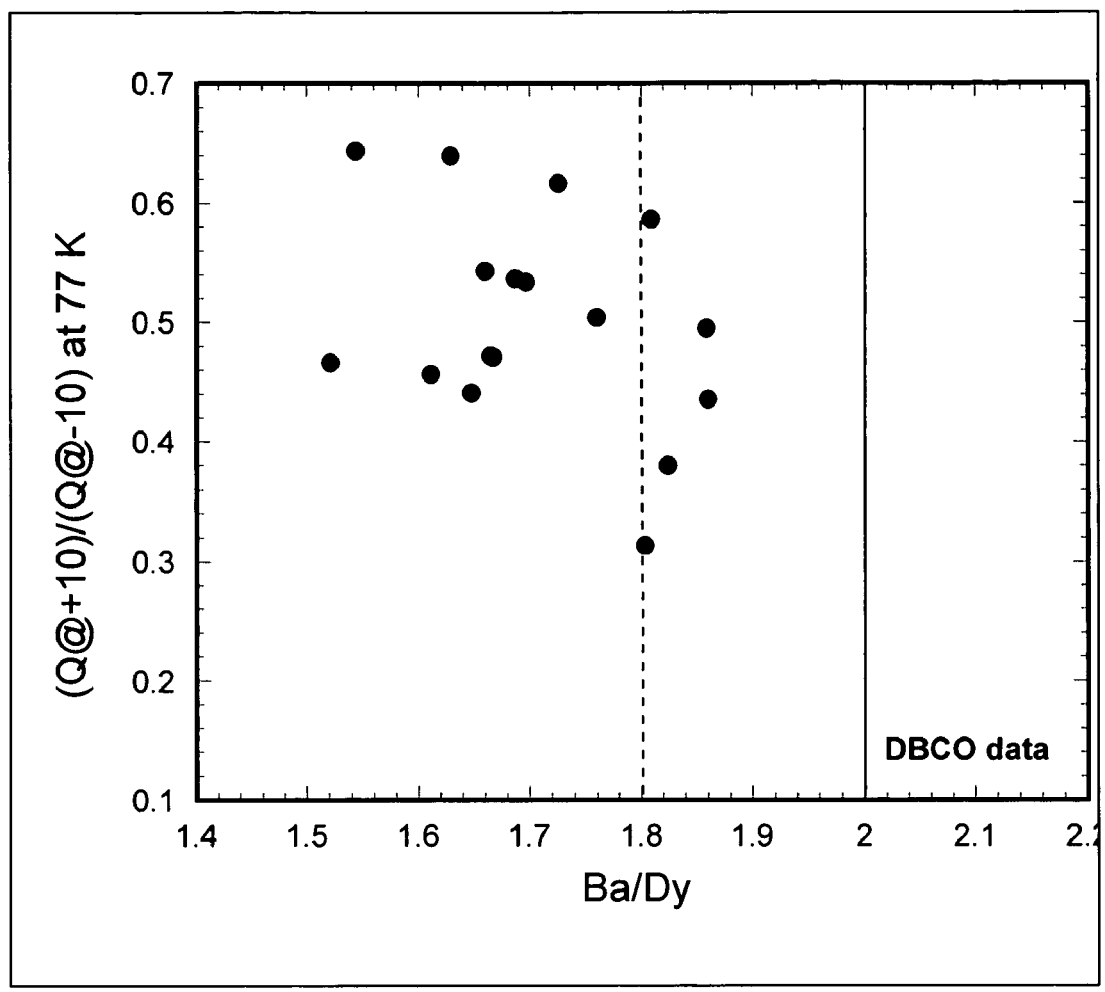
FIG. 30 displays the ratio of high power to low power Q factors for different compositions of the various Dy-BCO thin films indicated wherein the $Q_u$ values were measured at a temperature of 77 K.

The Q values of (RE)BCO filters can degrade as a function of increasing input power. The ability of (RE)BCO filters to maintain high Q values as a function of increasing input power is an important requirement for high performance filter systems. FIG. 29 displays the ratio of unloaded Q values at 67 K measured at high (+10 dBm) and low (−10 dBm) input powers for resonators made from DBCO film of different composition. High values of $Q_{+10dBm}/Q_{-10dBm}$ indicate better power handling capability and superior performance. It can be seen that increasingly higher ratios are obtained as the DBCO composition deviates further from the on-stoichiometric value (Ba/Dy=2), indicated by the solid vertical line. FIG. 30 plots the ratio of Q measured at high power to low power at 77 K for several DBCO films of varying composition. This figure also shows that excellent power handling is obtained even for compositions that deviate substantially from the on-stoichiometric value.

The input power levels to the (RE)BCO filter also affects their performance by generating different amounts of intermodulation distortion, as described below.

Figure 20:
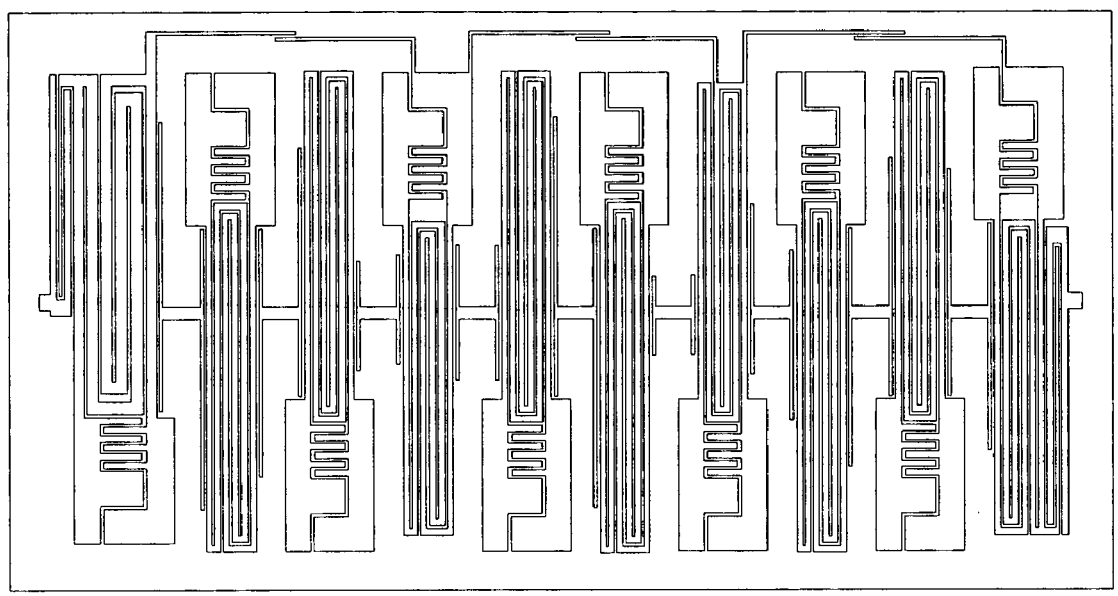
FIG. 20 shows the layout of the 10-pole B-band cellular filter design used for our IMD tests. The filter dimensions are 18-mm by 34-mm.
Figure 21:
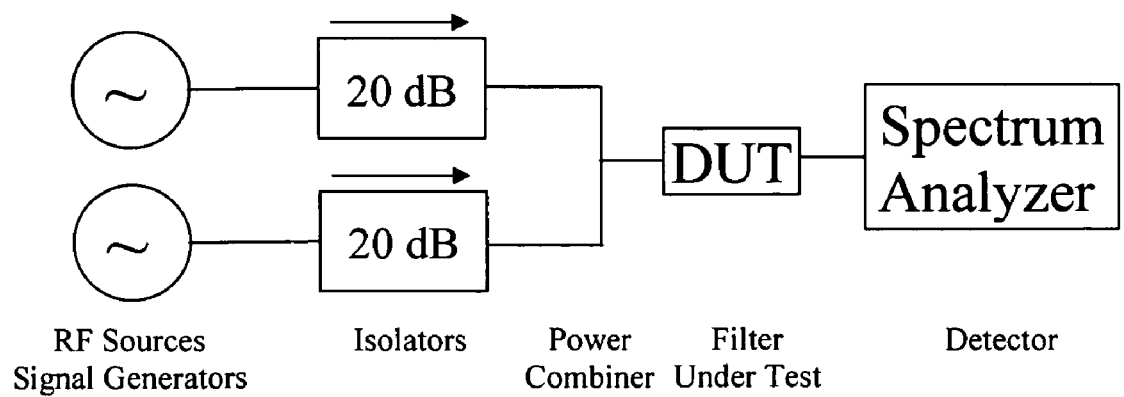
FIG. 21 shows a block diagram for an intermodulation distortion measurement of an HTS filter.

We further evaluated these materials by growing thin films on 2" MgO substrates and patterning them into 10-pole filter circuits of a type suitable for commercial cellular communications applications. FIG. 20 shows a layout of the filter design. The filters were tuned, and their performance was evaluated in terms of insertion loss, return loss, and out-of-band rejection. In addition, we used these 10-pole filters to measure the nonlinear properties of these materials in terms of their third-order intermodulation distortion (IMD). A block diagram of the test setup is shown in FIG. 21. For these measurements, tones of equal power at two different closely-spaced frequencies $f_1$ and $f_2$ were combined and applied to the filter at specific power levels. The location of these input tones is in-band, far from the band edge, or close to the band edge. The output power of the third-order mixing product at frequency $2f_1-f_2$ is then measured in a spectrum analyzer. The magnitude of the output signal from the filter at these frequencies is an important measure of the RF nonlinearities of the filter and determines its suitability for many microwave applications. The presence of intermodulation distortion reflects the current density dependence of the surface reactance, $X_s$, of the superconducting thin film (T. Dahm & D. J. Scalapino, J. Appl. Phys. 81 (4), pp 2002-2009) (1997). In contrast, nonlinearity in the surface resistance, $R_s$, of the thin film would be reflected in an increase in the insertion loss of the filter. This type of nonlinearity is not generally a limiting factor in the application of superconducting thin films to RF and microwave filters.

We have utilized three IMD tests to assess the applicability of our HTS thin film materials for applications in RF/microwave filters.

1. In-band Test. Two-tone input signals are applied near the center of the AMPS B Passband (835 MHz to 849 MHz). The input frequencies are at $f_1$=841.985 MHz and $f_2$=842.015 MHz at power levels of −20 dBm each. The intermodulation spurious product is measured at 842.045 MHz. The intermodulation spurious product power at this frequency measured at the output of the filter must be <−105 dBm.
2. Near-Band Test. Equal amplitude input signals are applied at 851 MHz and 853 MHz, and the intermodulation spurious product power level is measured at 849 MHz. The specification is the minimum power level of input tones that produce intermodulation spurious products in the AMPS B Passband with power levels of −130 dBm at the output. This input power level must be >−28 dBm.
3. Out-of-Band Test. Equal amplitude input signals are applied at 869.25 MHz and 894 MHz, and the intermodulation product is measured at 844.5 MHz. The requirement is the minimum power level of input tones to cause intermodulation products in the AMPS B System Passband to reach −130 dBm at the output of the filter. This input test signal power levels must be >−12 dBm.

Figure 22:
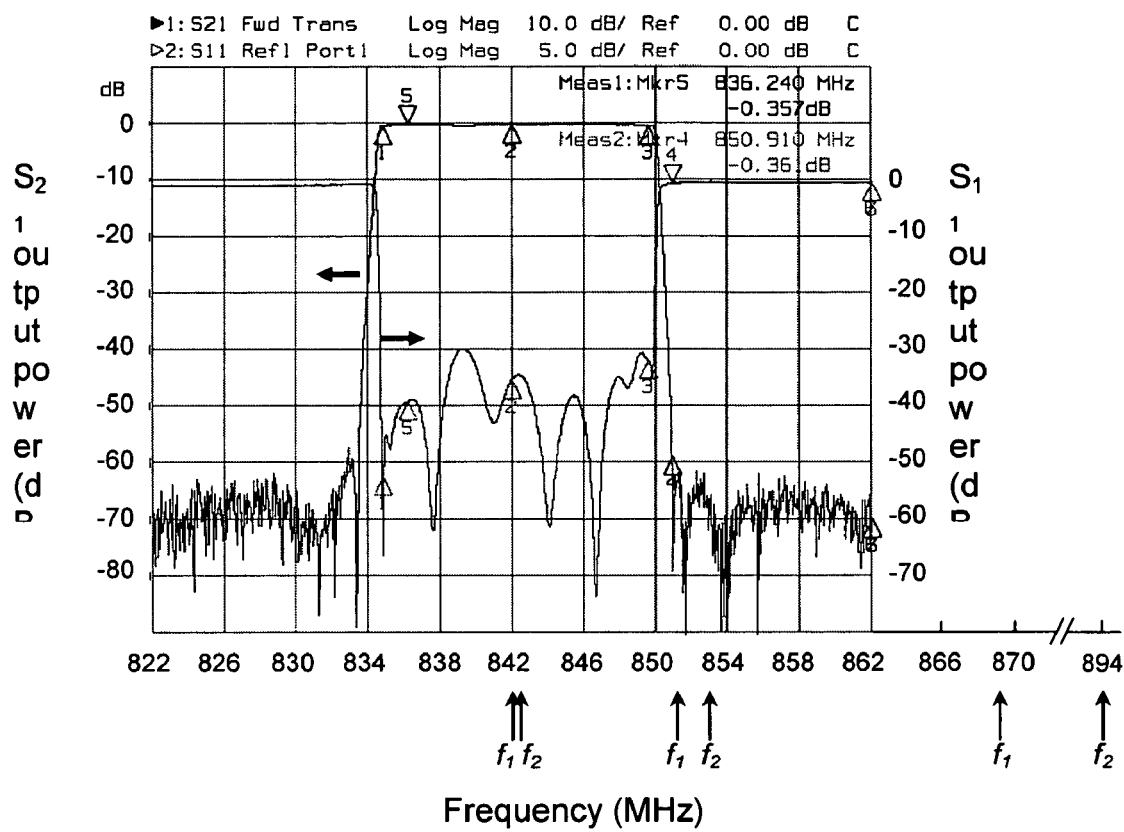
FIG. 22 shows the typical $S_{11}$ response of a 10-pole B-band cellular RF filter fabricated from a (RE)BCO thin film. The positions of the input frequencies for three two-tone intermodulation distortion test measurements are shown.

We fabricated B-band cellular microwave filters from several (RE)BCO thin films which were grown by in situ reactive coevaporation onto 2" MgO substrates. Each double-sided wafer yields two filters, each having a size of 18 mm×34 mm. The patterned (RE)BCO structures are quasi-elliptic 10-pole filters with 3 pairs of transmission zeros on either side of the frequency passband. FIG. 22 shows the typical response of such a filter. The positions of the frequencies for the two-tone IMD tests are shown.

Figure 23:
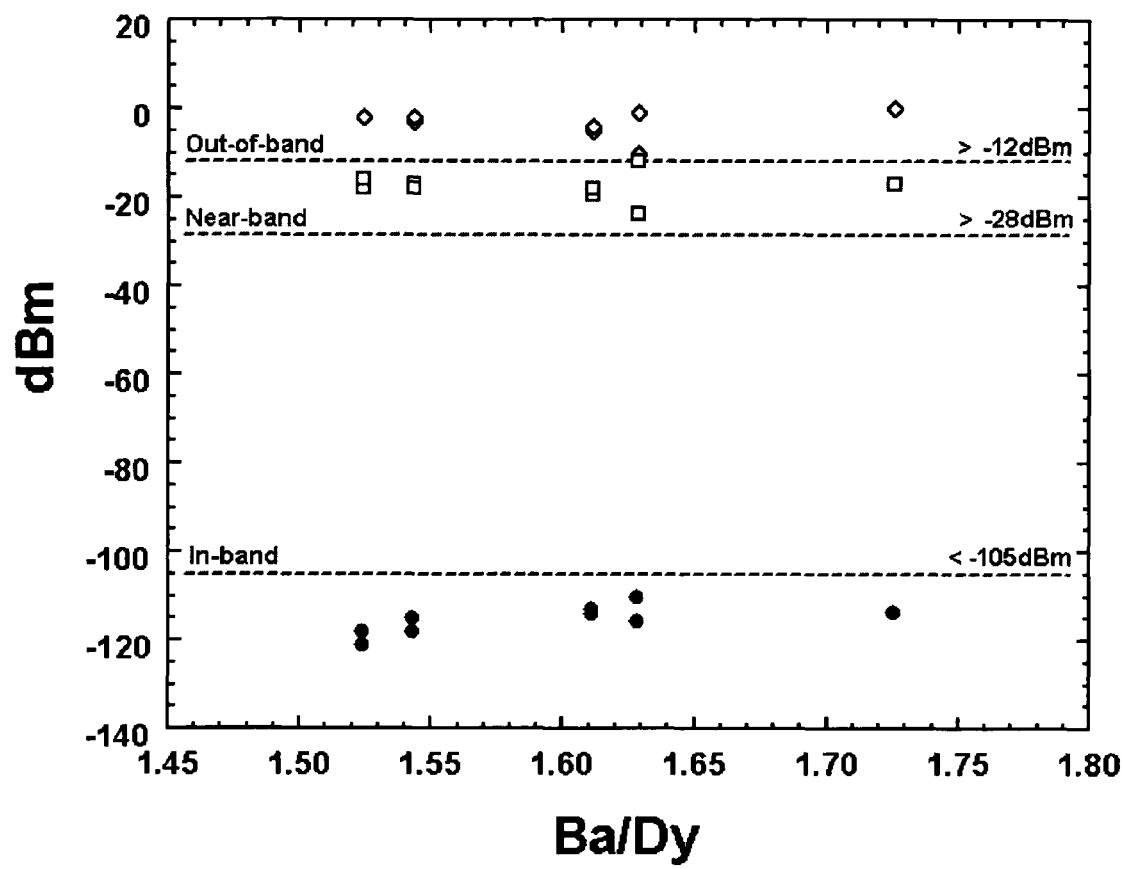
FIG. 23 shows the results of intermodulation distortion (IMD) test measurements made at 79.5 K as a function of the Ba/Dy ratio for several 10-pole B-band filters patterned from Dy-BCO films. The dotted lines indicate the required specification levels.
Figure 24:
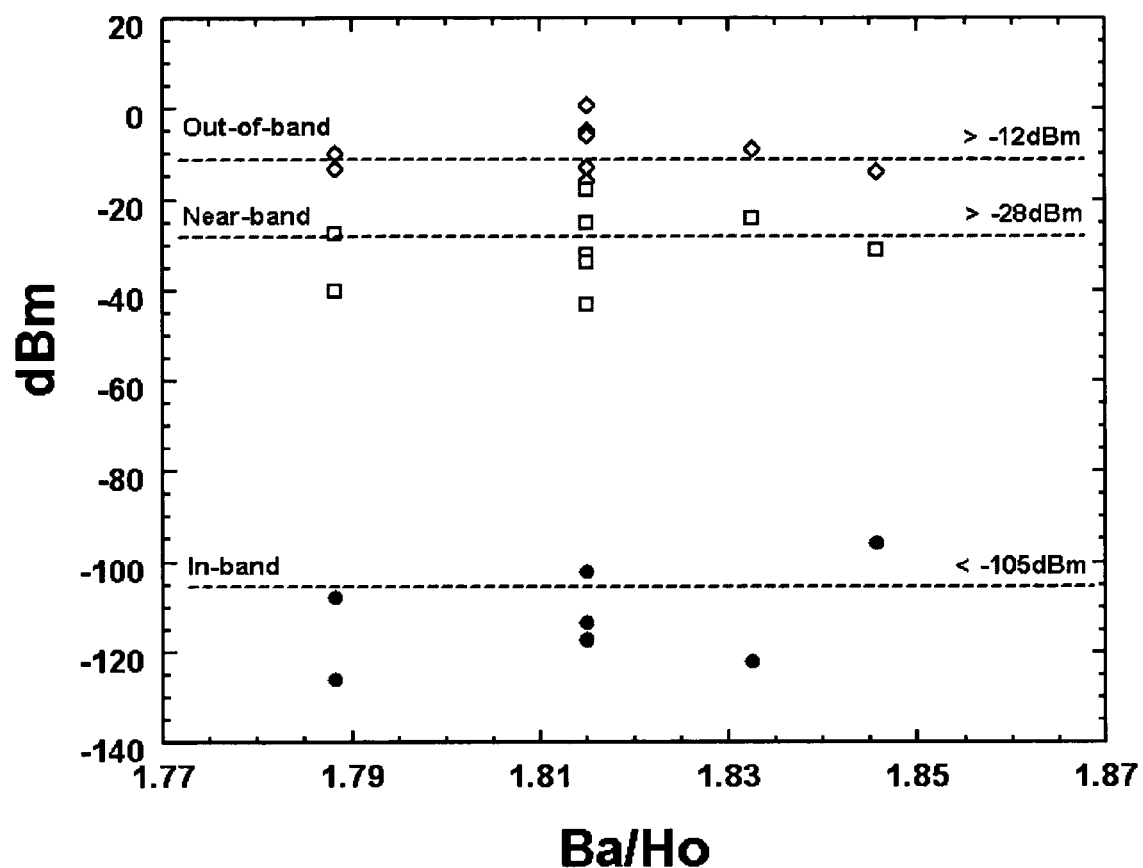
FIG. 24 shows the results of IMD test measurements made at 79.5 K as a function of the Ba/Ho ratio for several 10-pole B-band filters patterned from Ho-BCO films. The dotted lines indicate the required specification levels.
Figure 25:
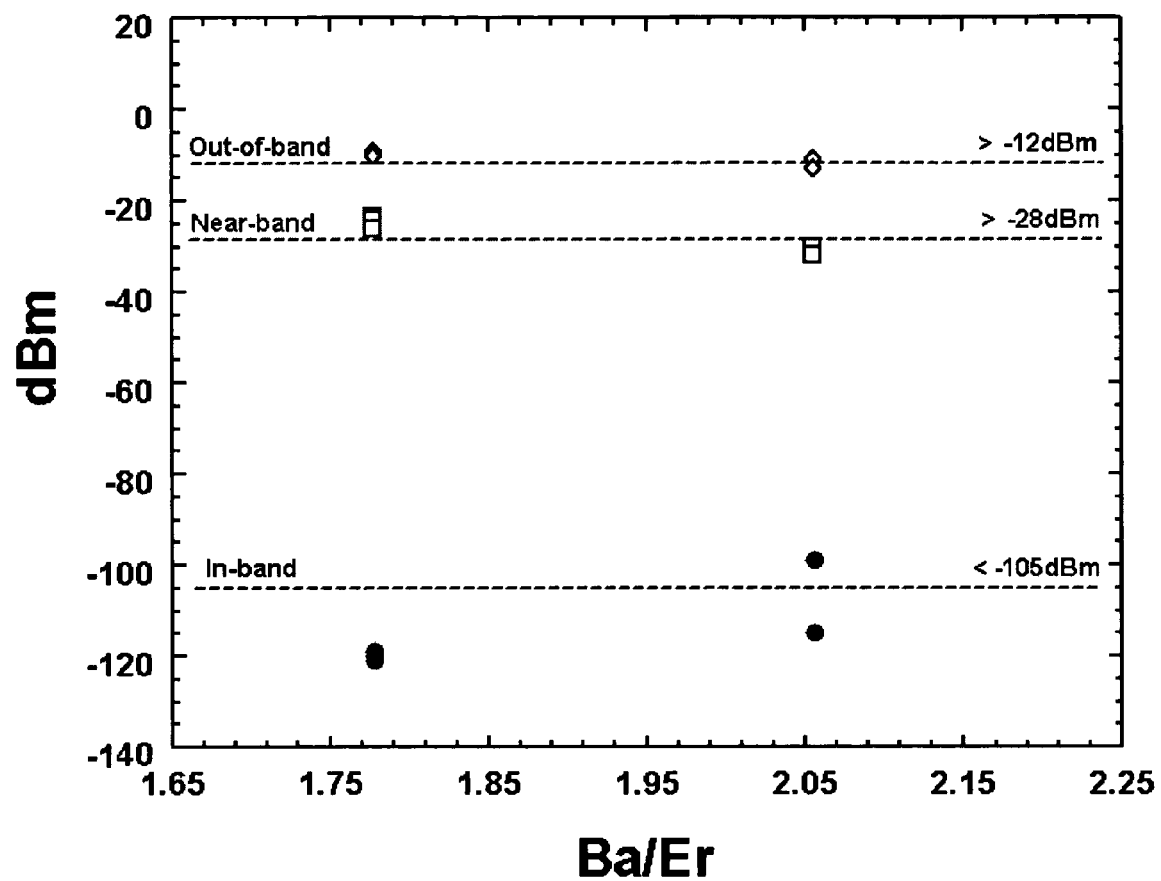
FIG. 25 shows the results of IMD test measurements made at 79.5 K as a function of the Ba/Er ratio for several 10-pole B-band filters patterned from Er-BCO films. The dotted lines indicate the required specification levels.
Figure 26:
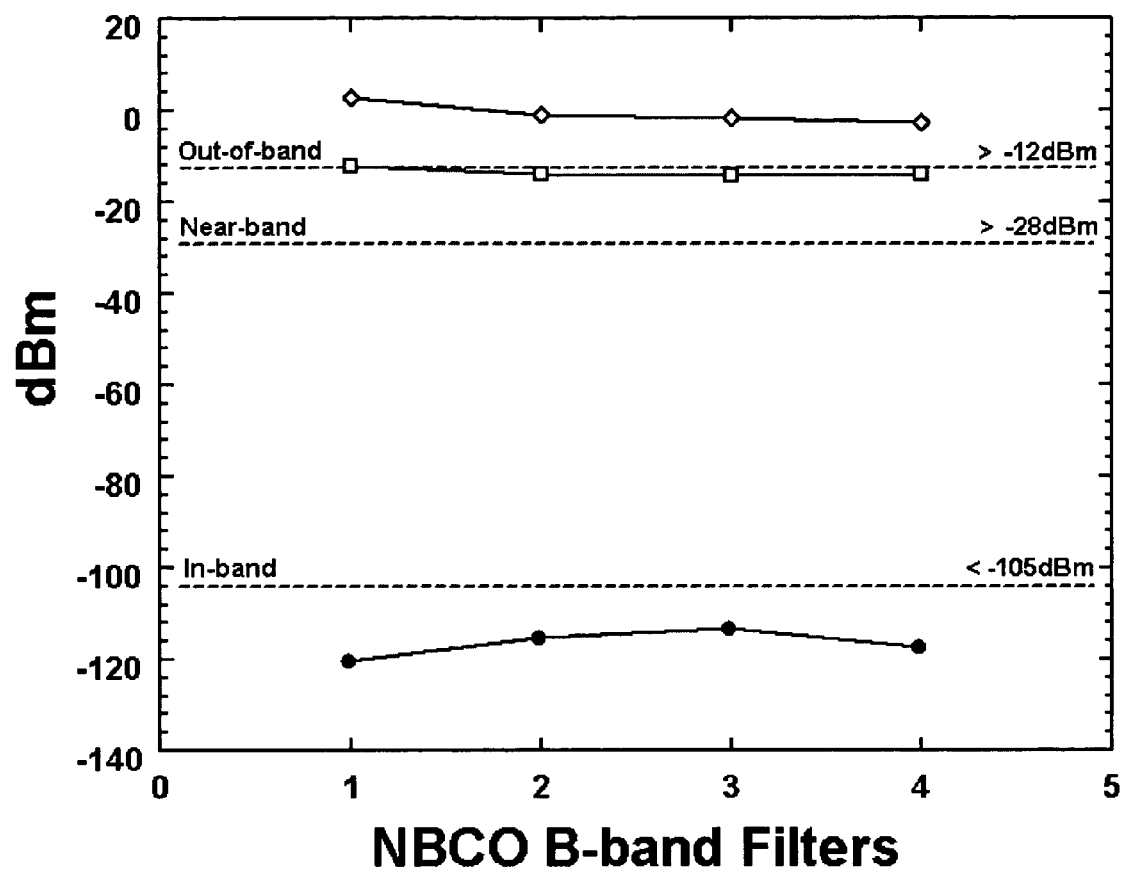
FIG. 26 shows the results of IMD test measurements made at 79.5 K for four 10-pole B-band filters patterned from Nd-BCO films. The dotted lines indicate the required specification levels.

FIG. 23 shows the IMD values measured at 79.5 K as a function of Ba/Dy ratio for several 10-pole B-band filters patterned from optimized Dy-BCO films. Note that all the filters measured meet the requirements, which are indicated by dotted lines. FIGS. 24 and 25 show the IMD values as a function of the Ba/RE ratio measured at 79.5 K for several 10-pole B-band filters patterned from optimized Ho-BCO and Er-BCO films. FIG. 26 shows the IMD values measured at 79.5 K for four 10-pole B-band filters patterned from optimized Nd-BCO films.

Intermodulation distortion in HTS filters arises due to non-linearity of the microwave surface reactance, $X_s$, of the thin films. (R. B. Hammond et al, J. Appl. Phys. 84 (10) pp 5662-5667 (1998)). In general, at high microwave current densities in HTS thin films $X_s$ ceases to be constant and independent of current density, and begins to increase with increasing current density. Commonly there is a maximum current density, $J_{IMD}$, at which $X_s$ retains its low current density value, and above which $X_s$ increases. In this paper by Hammond et al, the relationships between measured parameters and the material parameter $J_{IMD}$ are described. This relationship can be summarized as follows $$j_{IMD} = \frac{Q_L^2}{\omega_0} \frac{1}{\Gamma_{IMD}} \sqrt{\frac{P_{IN}^3}{P_{OUT}}}$$

here $Q_L$ is the loaded quality factor of the resonator, $\omega_0$ is the resonant frequency, these two functions depend on the filter function to be realized, $\Gamma_{IMD}$ is a factor which depends only on the geometry of the resonator, and $P_{IN}$ and $P_{OUT}$ are the input and output powers from an intermodulation measurement.

The out-of-band IMD test requirement corresponds to a minimum $J_{IMD}$ in the HTS thin film of $1\times10^7$ A/cm$^2$. The DBCO films surpass the specification by 14 dB, which here corresponds to a factor of 5. Thus, the DBCO films have a $J_{IMD}$ of $5\times10^7$ A/cm$^2$. For filter applications $J_{IMD}$ in HTS thin films must be >$1\times10^7$ A/cm$^2$, more preferably >$2\times10^7$ A/cm$^2$, and most preferably >$3\times10^7$ A/cm$^2$.

Methods of Manufacture

We have grown our (RE)BCO thin films using an in situ reactive coevaporation (RCE) deposition technique which has been successfully used to manufacture large-area YBCO HTS thin films. This is a fabrication technique that readily lends itself to high volume film production and manufacturability. The yield of high-performance microwave filters made from films grown by RCE is typically >90%. A key component of this growth method is the use of a radiative heater that internally maintains an oxygen partial pressure that is greater than ~10 mTorr. The heater also incorporates a window that allows exposure of the rotating substrates to high vacuum, where evaporation and deposition of the source materials occurs. Our substrates are typically MgO single crystals up to 2" in diameter that are rotated continuously between the window and the oxidation pocket at 300 rpm. The chamber ambient pressure away from the pocket is ~$10^{-5}$ Torr. This configuration provides sufficient oxygen pressure for stability of the high-$T_c$ phase while the metallic evaporation sources are simultaneously free from oxidation, and the evaporated species are free from scattering. The rare earth elements Er, Ho, and Dy are evaporated from electron beam sources, Nd and Cu are evaporated from either electron beam sources or resistive sources, and Ba is evaporated from a thermal furnace or a resistive source. The typical deposition rate is ~2.5 Å/sec. The deposition temperature for the films discussed here is 760 to 790° C., and the film thickness is about 700 nm. The films were deposited directly onto MgO substrates, with the exception of Nd-BCO, which presently requires a thin buffer layer in order to achieve the best results.

Unlike yttrium, which melts readily, some rare earth elements such as Er, Ho, and Dy sublime during e-beam evaporation, thereby making compositional control more challenging. We routinely use quartz crystal monitors (QCM) as our primary rate controllers. However, the subliming materials are never molten at our evaporation rates; rather, the electron beam digs a hole in the metallic source material so that the plume shape changes significantly during the course of the deposition run. Therefore, the QCMs are not able to correctly monitor the changing amount of RE vapor flux. To alleviate this difficulty we have employed hollow-cathode-lamp (HCL) atomic absorption (AA) evaporation flux sensors to monitor and control these subliming materials. Since the AA light beam passes through the entire plume of evaporated species, this technique can more accurately monitor the amount of evaporated flux.

The oxygen pocket pressure and deposition rate used to achieve optimal results are similar for the (RE)BCO films that we have studied. We have found that the best substrate temperatures for Er, Ho, Dy, and Nd are 780, 790, 790, and 780° C., respectively. These temperatures are significantly higher than the temperature of 760° C. we use to achieve optimal RF properties for YBCO. The use of different growth conditions for the (RE)BCO materials compared to YBCO is mandatory in order to achieve the very best RF properties. For example, higher growth temperatures for the (RE)BCO materials as compared to YBCO are generally required in order to insure the absence of deleterious misaligned grains. The composition must also be optimized for this purpose, as we have discussed. In general, many aspects of film growth affect the defect structure in (RE)BCO thin films, and thus RF properties, including a) growth temperature, b) growth rate, c) oxygen pressure, and d) stoichiometry. Specific choices for (a), (b), and (c) may yield different optimized properties and different optimized compositions.

Although the foregoing invention has been described in some detail by way of illustration and example for purposes of clarity and understanding, it may be readily apparent to those of ordinary skill in the art in light of the teachings of this invention that certain changes and modifications may be made thereto without departing from the spirit or scope of the appended claims.

We claim:

1. A superconducting article comprising:
a substrate, and
a thin film disposed on the substrate having the nominal composition of
$RE_zBa_yCu_3O_x$
wherein RE is a rare earth, x is between 6 and 7 inclusive and wherein y is less than about 2.1 and the ratio of y/z is 1.65±10%, and
wherein the $J_{IMD}$ at 850 MHz is >0.8×$10^7$ A/cm2 at 77K.

2. The article of claim 1 wherein y is less than about 2.1 and the ratio of y/z is 1.65±6%.

3. The article of claim 1 wherein y is less than about 2.1 and the ratio of y/z is 1.65±3%.

4. The article of claim 1 wherein the $R_s$ at 1.85 GHz at 77K is less than 15 micro-ohms.

5. The article of claim 1 wherein the article includes 45-degree grain boundaries in a concentration<1%.

6. The article of claim 1 wherein the thin film is deposited on the substrate by reactive coevaporation.

7. The article of claim 1 wherein the thin film has a superconducting transition temperature>87K.

8. The article of claim 1 wherein the substrate has a surface area>3 square inches.

9. The article of claim 1 wherein the thin film is patterned into a radio frequency circuit with high Q circuit elements.

10. A superconducting article with improved microwave qualities comprising:
a substrate, and
a thin film disposed on the substrate having the nominal composition of
$RE_zBa_yCu_3O_x$
wherein RE is a rare earth and not yttrium, x is between 6 and 7 inclusive, y is less than about 2.1 and the ratio of y/z is 1.65±10%,
wherein the $J_{IMD}$>0.8×$10^7$ A/cm$^2$ at 77K and
wherein the superconducting article has a superconducting transition temperature>87K.

11. The composition of claim 10 wherein the $J_{IMD}$>1.5×$10^7$ A/cm$^2$ at 77K.

12. The composition of claim 11 wherein the $J_{IMD}$>3×$10^7$ A/cm$^2$ at 77K.

13. A superconducting article with improved microwave qualities comprising:
a substrate, and
a thin film disposed on the substrate having the nominal composition of
$RE_zBa_yCu_3O_x$
wherein RE is a rare earth and not yttrium, x is between 6 and 7 inclusive, y is less than about 2.1 and the ratio of y/z is 1.65±10%, and
wherein the $R_s$<15 μΩ when measured at 1.85 GHz and 77K.

14. The composition of claim 13 wherein $R_s$<10 μΩ when measured at 1.85 GHz and 77K.

15. The composition of claim 14 wherein $R_s$<8 μΩ when measured at 1.85 GHz and 77K.

16. A superconducting article comprising:
a substrate, and
a thin film disposed on the substrate having the nominal composition of
$Dy_zBa_yCu_3O_x$
wherein y is less than about 2.1, the ratio of y/z is 1.65±10% and x is between 6 and 7 inclusive, and
wherein the superconducting article has a superconducting transition temperature>87K.

17. The article of claim 16 wherein y is less than about 2.1 and the ratio of y/z is 1.65±6%.

18. The article of claim 17 wherein y is less than about 2.1 and the ratio of y/z is 1.65±3%.

19. The article of claim 16 wherein the $J_{IMD}$ at 850 MHz is >0.8×$10^7$ A/cm$^2$ at 77K.

20. The article of claim 16 wherein the $R_s$ at 1.85 GHz at 77K is less than 15 micro-ohms.

21. The article of claim 16 wherein the article includes 45-degree grain boundaries at a concentration of <1%.

22. The article of claim 16 wherein the thin film is deposited on the substrate by reactive coevaporation.

23. The article of claim 16 wherein the substrate has a surface area>3 square inches.

24. The article of claim 16 wherein the thin film is patterned into a radio frequency circuit with high Q circuit elements.

25. A superconducting composition comprising:
   a substrate, and
   a thin film disposed on the substrate having the nominal composition of $Nd_zBa_yCu_3O_x$,
   wherein y is less than about 2.1, the ratio of y/z is 1.65±10%, and x is between 6 and 7 inclusive, and
   wherein the $J_{IMD}$ at 850 MHz is >0.8×10$^7$ A/cm$^2$ at 77K.

26. The article of claim 25 wherein the $R^s$ at 1.85 GHz at 77K is less than 15 micro-ohms.

27. The article of claim 25 wherein the article includes 45-degree grain boundaries at a concentration of <1%.

28. The article of claim 25 wherein the thin film is deposited on the substrate by reactive coevaporation.

29. The article of claim 25 wherein the thin film has a superconducting transition temperature>87K.

30. The article of claim 25 wherein the substrate has a surface area>3 square inches.

31. The article of claim 25 wherein the thin film is patterned into a radio frequency circuit with high Q circuit elements.

32. A superconducting article comprising:
   a substrate, and
   a thin film disposed on the substrate having the nominal composition of $RE_zBa_yCu_3O_x$
   wherein RE is a rare earth, wherein the ratio of y/z is 1.65±10% and x is between 6 and 7 inclusive,
   the article including 45-degree grain boundaries in a concentration of <1%.

* * * * *